United States Patent [19]
Sugiyama

[11] Patent Number: 5,245,561
[45] Date of Patent: Sep. 14, 1993

[54] ADAPTIVE FILTER CAPABLE OF QUICKLY IDENTIFYING AN UNKNOWN SYSTEM

[75] Inventor: Akihiko Sugiyama, Tokyo, Japan

[73] Assignee: NEC Corporation, Tokyo, Japan

[21] Appl. No.: 813,662

[22] Filed: Dec. 27, 1991

[30] Foreign Application Priority Data

| Dec. 27, 1990 | [JP] | Japan | 2-416129 |
| Dec. 28, 1990 | [JP] | Japan | 2-416931 |
| Jan. 31, 1991 | [JP] | Japan | 3-31503 |

[51] Int. Cl.$^5$ .................................... G06F 15/31
[52] U.S. Cl. ................... 364/724.19; 364/724.16; 364/724.2
[58] Field of Search ............. 364/724.19, 724.2, 724.16

[56] References Cited

U.S. PATENT DOCUMENTS

| 4,374,426 | 2/1983 | Burlage et al. | 364/724.2 |
| 4,727,424 | 2/1988 | Chao | 358/167 |
| 4,933,891 | 6/1990 | Schenk | 364/724.16 |
| 5,050,119 | 9/1991 | Lish | 364/724.16 |
| 5,146,494 | 9/1992 | Harman | 364/724.19 |

OTHER PUBLICATIONS

J. Nagumo et al, "A Learning Method for System Identification", IEEE Transactions on Automatic Control, vol. AC-12, No. 3, Jun. 1967, pp. 282-287.

"Adaptive Signal Processing" published in 1985 by Prentice Hall, pp. 337-347.

S. Kawamura et al, "A Tap Selection Algorithm For Adaptive Filters", ICASSP 86 Tokyo (CH2243-4/86/0000-2979 1986), pp. 2979-2982.

Primary Examiner—David H. Malzahn
Attorney, Agent, or Firm—Sughrue, Mion, Zinn, Macpeak & Seas

[57] ABSTRACT

In an adaptive filter formed by first through N-th delay elements connected in series to one another to define first through N-th taps, first through M-th coefficient circuits which are smaller in number than the delay elements and which produce first through M-th coefficient signals together with first through M-th calculated signals, an adder for summing up the first through the M-th calculated signals to produce an echo replica signal, and a subtractor for subtracting the echo replica signal from an echo signal to produce an error signal, a matrix switch circuit is arranged between the first through the N-th taps and the first through the M-th coefficient circuits and is controlled by a control circuit to adaptively select, from the first through the N-th taps, first through M-th taps connected as active taps to the first through the M-th coefficient circuits. The control circuit supplies the matrix switch with a matrix control signal which includes active tap numbers assigned to the active taps. A plurality of the active taps may be replaced by changing a replacement time interval determined by the control circuit with reference to a result of monitoring the error signal or the coefficient signals.

17 Claims, 13 Drawing Sheets

ADAPTIVE FILTER CAPABLE OF QUICKLY IDENTIFYING AN UNKNOWN SYSTEM

BACKGROUND OF THE INVENTION

This invention relates to an adaptive filter for use in identifying an unknown system. It is to be noted here that such an adaptive filter is used as an echo canceller for cancelling an echo which occurs in a two-wire/-four-wire hybrid, an equalizer for cancelling an intersymbol interference imposed on a transmission line, a noise canceller for cancelling a noise leaking in an acoustic microphone, a howling canceller for cancelling howling which results from acoustic coupling between a loudspeaker and a microphone, and so on.

A conventional adaptive filter of the type described is coupled to an unknown system to be identified. Herein, the unknown system may be, for example, a two-wire/-four-wire hybrid, a transmission path, and the like. At any rate, the adaptive filter is supplied from an external device, such as a microphone, with an input signal given in the form of a sequence of sampled input signals each of which is sampled at every one of sampled periods. In addition, the adaptive filter is supplied with an external signal which is sent from the unknown system and which may be, for example, an echo signal in an echo canceller.

At any rate, the adaptive filter produces, as an output signal, an identification error signal appearing as a result of identification of the unknown system. The identification error signal may be simply called an error signal hereinunder. In order to obtain the error signal, the adaptive filter calculates a replica of the echo signal from the input signal and the error signal to produce an echo replica signal representative of the replica of the echo signal and subtracts the echo replica signal from the echo signal to produce the error signal.

More specifically, the adaptive filter comprises a plurality of delay elements which define taps and which are connected in cascade to one another through the taps. The sampled input signals are successively given to the delay elements on one hand and given to the unknown system on the other hand. The sampled input signals are delayed by the sample periods to be produced as delayed signals through the taps while they are produced through the unknown system as the external signal. The taps are connected to a plurality of tap gain control circuits which determine tap coefficients of the taps. The tap gain control circuits produce tap coefficient signals representative of the tap coefficients.

With this structure, the gain control circuits supply the tap coefficient signals to an adder circuit to calculate a sum of the tap coefficient signals. The adder circuit delivers, as the echo replica signal, a sum signal representative of the sum to a subtractor supplied with the external signal. The subtractor subtracts the echo replica signal from the external or the echo signal to produce the error signal. Furthermore, the error signal is delivered to the tap gain control circuits to adaptively renew or modify the tap coefficients of the taps.

In order to renew or modify the tap coefficients, proposal has been made about adaptive filters which are operable in accordance with LMS (least mean square) algorithm which is described in "Adaptive Signal Processing" published in 1985 by Prentice Hall and a learning identification method (LIM) which is disclosed in IEEE Transactions on Automatic Control (Vol. 12, 3, 1967 on pages 282 to 287), respectively. In any event, such adaptive filters should have taps of a number determined by a length of an impulse response in the unknown system. In other words, the number of the taps increases as the impulse response becomes long.

In the interim, it often happens that the impulse response has a long flat delay portion, a significant part of a dispersive portion, and a tail portion in a certain unknown system, such as a satellite communication system. An adaptive filter may be used as an echo canceller to cancel an echo in the satellite communication system. Inasmuch as the impulse response has long flat delay part and taps must be prepared for such a long flat delay part also, the adaptive filter should have a great number of the taps.

Herein, it is pointed out that the tap coefficients for the long flat delay part might be equal to zero and actually become useless on calculation of the echo replica signal. Taking this into consideration, an identification method has been proposed in an article contributed by S. Kawamura et al to ICASSP 86 Tokyo (CH2243-4/86/0000-2979 1986, 1986) (pages 2979 to 2982) so as to effectively identify an unknown system even when an impulse response has a long flat delay part together with a significant part. With this method, processing is made by selecting tap coefficients which are positioned at the significant part and by calculating the echo replica signal by the use of only the selected tap coefficients. Such selected tap coefficients are successively changed from one to another until an optimum tap set is found out.

However, a long time is required in the above-mentioned method to approximate the impulse response having the long flat delay part and to converge the tap coefficients into stable values.

SUMMARY OF THE INVENTION

It is an object of this invention to provide an adaptive filter which is small in size and which has a short convergence time.

An adaptive filter to which this invention is applicable is for use in identifying an unknown system by responding to an input signal and an external signal which is from the unknown system and by producing an error signal appearing as a result of identification of the unknown system. The input signal is given to the adaptive filter in the form of a sequence of sampled input signals each of which is sampled at every one of sample periods. The adaptive filter comprises first through N-th delay elements connected in series to one another to define first through N-th taps for successively delaying the sampled input signals by every one of the sample periods to produce first through N-th delayed signals through the first through the N-th taps, respectively, where N is a natural number, processing means supplied with the first through the N-th delayed signals for processing the first through the N-th delayed signals to produce an echo replica signal representative of a replica of the echo signal, and subtracting means for subtracting the echo replica signal from the echo signal to produce the error signal. According to this invention, the processing means comprises a controllable matrix switch supplied with the first through the N-th delayed signals and with a switch control signal for selectively switching the first through the N-th taps to select first through M-th taps from the first through the N-th taps and to produce the first through the M-th ones of the delayed signals as first through M-th local signals where M is a natural number smaller than N, first through M-th calculation means supplied with the first through the M-th local signals for carrying out calculation between first through M-th coefficients and the first through the M-th local signals to obtain first through M-th calculated results and to produce first through M-th calculated signals which are representative of first through M-th calculated results, respectively, summing means for summing the first through the M-th calculated signals to produce the echo replica signal, control means coupled to the first through the M-th calculation means and the controllable matrix switch for controlling the controllable matrix switch to adaptively replace the first through the M-th taps into first through M-th renewed taps by monitoring the first through the M-th coefficient signals and the error signal and to thereby produce a tap control signal representative of the first through the M-th renewed taps; and means for supplying the tap control signal to the matrix switch as the matrix control signal.

DESCRIPTION OF THE PREFERRED EMBODIMENT

Figure 1:
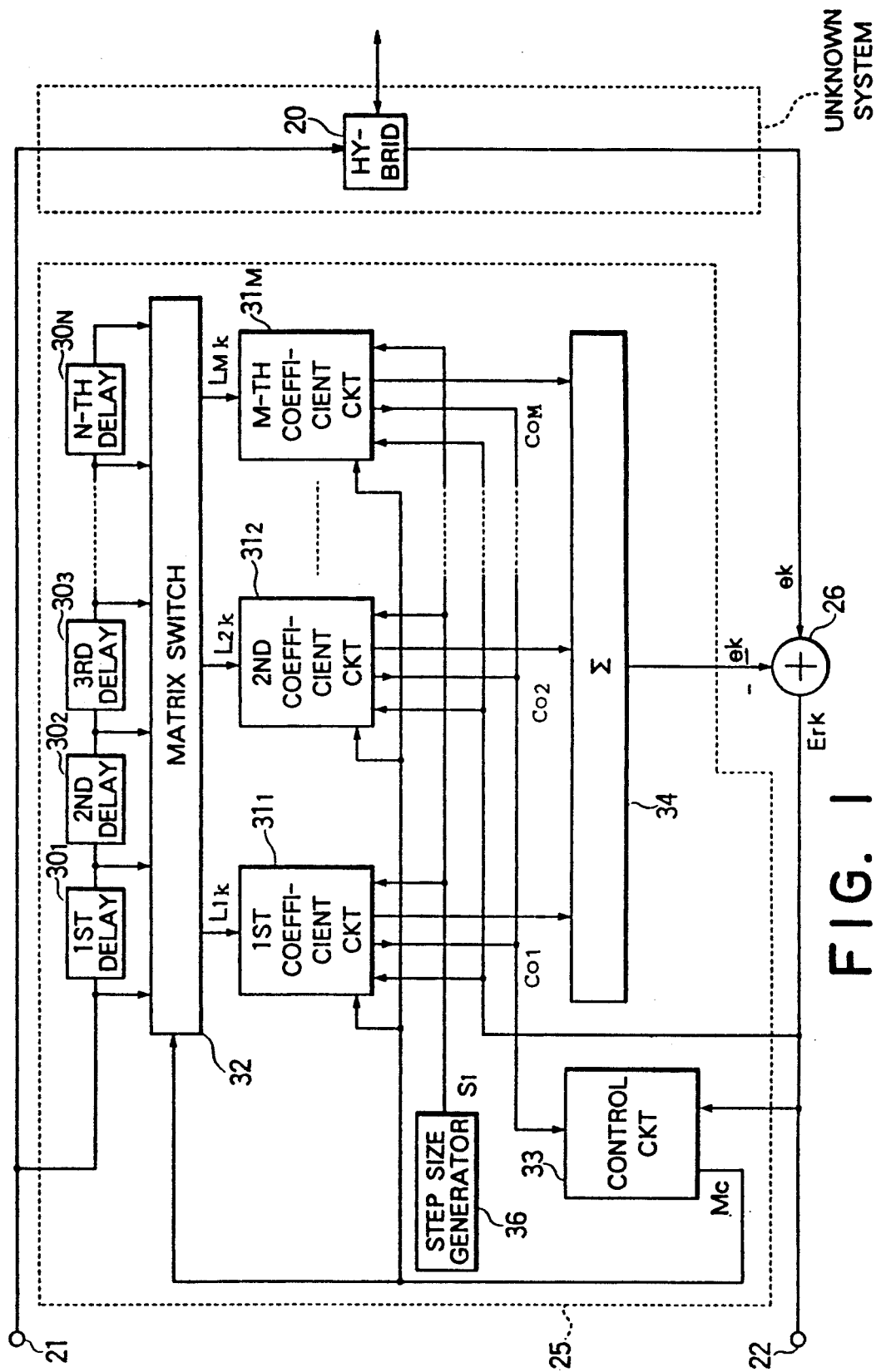
FIG. 1 is a block diagram of an adaptive filter according to a first embodiment of this invention.

Referring to FIG. 1, an adaptive filter according to a first embodiment of this invention is for use in identifying an unknown system which is specified by a two-wire/four-wire hybrid 20 in FIG. 1 without loss of generality. In this connection, the illustrated adaptive filter is connected to a four-wire side of the hybrid 20 while a two-wire side of the hybrid 20 is connected to a two-wire transmission line. The illustrated adaptive filter is supplied through an input terminal 21 with an input signal which is given in the form of a sequence of sampled input signals sampled at every one of sampling periods. In addition, the adaptive filter produces an error signal, namely, an external signal Erk through an output terminal 22.

In this event, the input signal is also sent as a transmission signal to the two-wire/four-wire hybrid 20 of the unknown system through an internal output line and appears as an internal signal or an echo signal $e_k$ through an internal input line. Thus, such an echo signal $e_k$ results from the input signal which leaks through the two-wire/four-wire hybrid 20.

The illustrated adaptive filter comprises a filter portion 25 operable in response to the input signal to produce an echo replica signal $e_k$ representative of a replica of the echo signal $e_k$ and a subtractor 26 for subtracting the echo replica signal $e_k$ from the echo signal $e_k$ to produce the error signal Erk, where k is a sample number.

In FIG. 1, the filter portion 25 comprises first through N-th delay elements $30_1$ to $30_N$ connected in cascade to one another to define zeroth through N-th taps, where N is a natural number greater than or equal to unity. Each tap is given by an input terminal and an output terminal of each delay element. At any rate, the sampled input signals are successively delayed by the first through the N-th delay elements $30_1$ to $30_N$ and produced through the zeroth tap and the first to the N-th taps as an undelayed signal and first through N-th delayed signals, respectively.

The illustrated filter portion 25 further comprises first through M-th coefficient circuits $31_1$ to $31_M$ which are not greater in number than the first through the N-th delay elements $30_1$ to $30_N$. Therefore, M is an integer smaller than or equal to N. In this connection, first through M-th ones of the zeroth through the N-th taps are adaptively or selectively connected to the first through M-th coefficient circuits $31_1$ to $31_M$ through a matrix circuit 32. Thus, the matrix circuit 32 is operable to select the first through the M-th ones of the N taps and to connect the first through the M-th taps to the first through the M-th coefficient circuits $31_1$ to $31_M$. To this end, the matrix switch 32 is controlled by a control circuit 33 in a manner to be described later in detail. From this fact, it is readily understood that the first through the M-th coefficient circuits $31_1$ to $31_M$ serves to adjust or control tap gains of M taps selected from the zeroth through the N-th taps and produce first through M-th calculated signals or coefficient signals representative of first through M-th calculated values or output coefficient values, respectively, as will become clear as the description proceeds. In other words, the first through the M-th coefficient circuits $31_1$ to $31_M$ are operable to calculate the first through the M-th calculated results and may therefore be called first through M-th calculation circuits, respectively.

The first through the M-th calculated signals are delivered from the first through the M-th coefficient circuits $31_1$ to $31_M$ to an adder circuit 34. The adder circuit 34 sums up the first through the M-th calculated signals to produce a sum signal representative of a sum of the first through the M-th output coefficient signals. The sum signal is sent as the echo replica signal $e_k$ to the subtractor 26.

Figure 2:
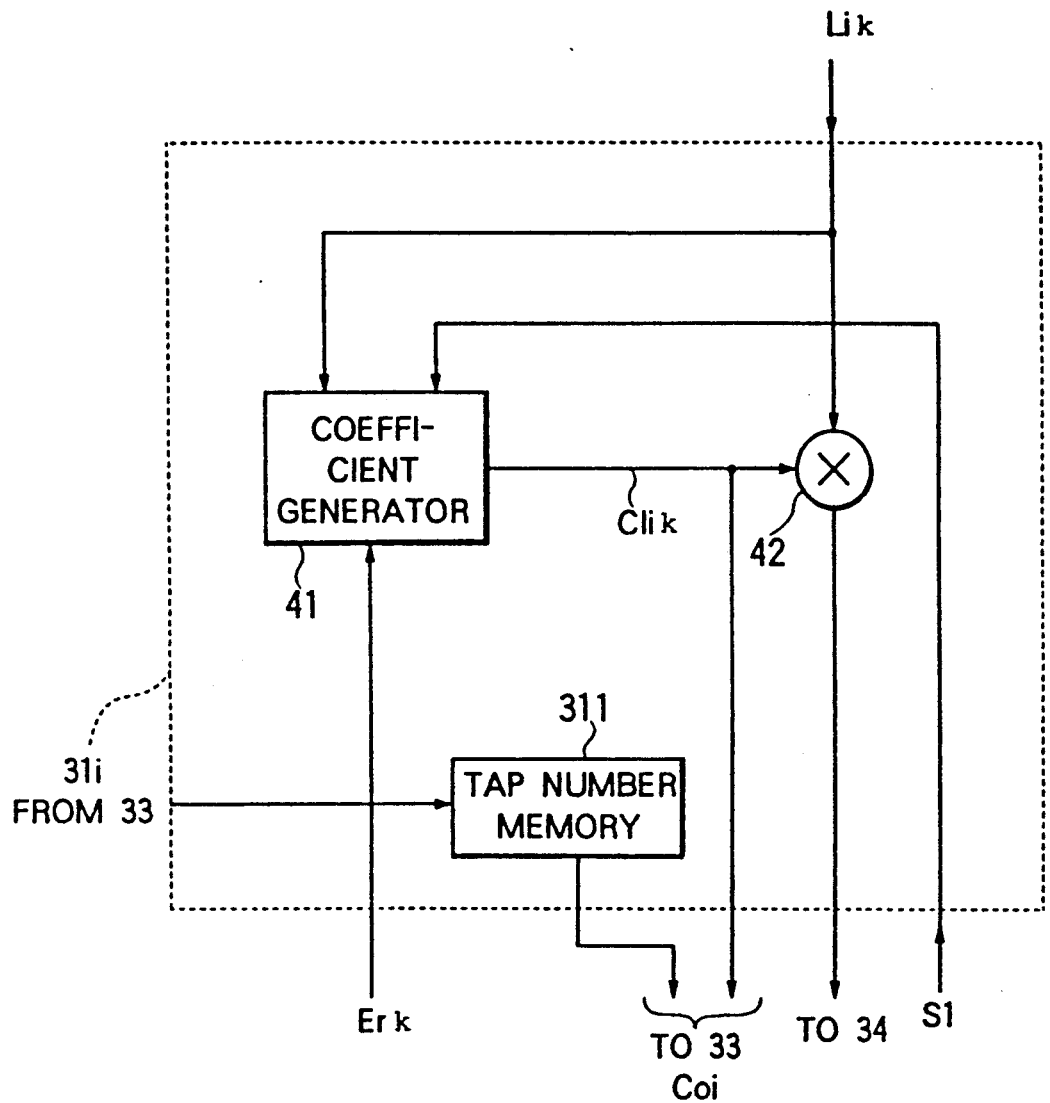
FIG. 2 is a block diagram of a coefficient circuit applicable to the adaptive filter illustrated in FIG. 1.

Referring to FIG. 2 together with FIG. 1, a single coefficient circuit (depicted at $31_j$) is illustrated as a representative of the first through the M-th coefficient circuits $31_1$ to $31_M$ which are similar in structure and operation to one another. It is assumed that the illustrated adaptive filter is operable in accordance with the LMS algorithm which is known in the art and which uses a step size or sizes. The illustrated coefficient circuit $31_i$ is supplied with the error signal Erk from the subtractor 26 with a step size signal S1 representative of the step size of the LMS algorithm. The step size signal S1 is given from a step size generator 36. In addition, the coefficient circuit $31_i$ is given either one of the undelayed signal and one of the first through the M-th delayed signals as a local signal depicted as Lik. This means that the first through the M-th coefficient circuits $31_1$ to $31_M$ (FIG. 1) are supplied with the first through the M-th local signals to produce first through M-th output coefficient signals $Co_1$ to $Co_M$, respectively.

Specifically, the coefficient circuit $31_i$ comprises a coefficient generator 41 supplied with the local signal Lik, the step size signal S1, and the error signal Erk to calculate internal coefficients in accordance with a predetermined algorithm, namely, the LMS algorithm and to produce internal coefficient signals CIik representative of the internal coefficients.

Figure 3:
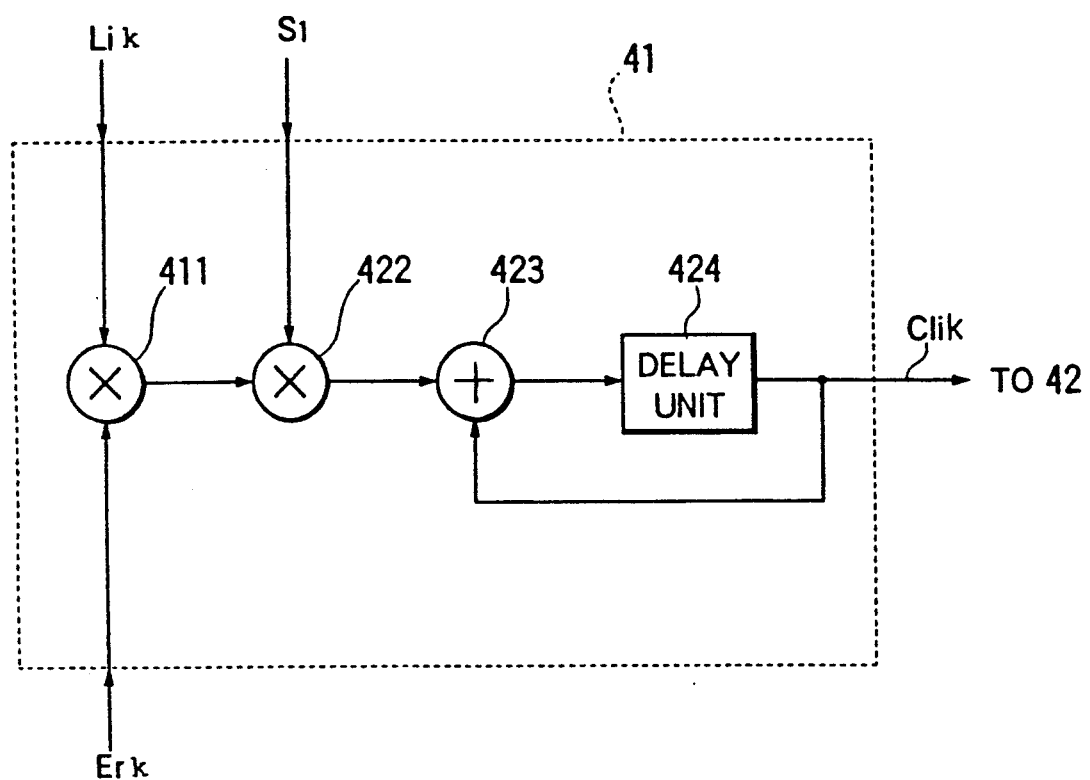
FIG. 3 is a block diagram of a coefficient generator of the coefficient circuit illustrated in FIG. 2.

Temporarily referring to FIG. 3 in addition to FIG. 2, the coefficient generator 41 illustrated in FIG. 3 is operable in accordance with the LMS algorithm, as mentioned above. The illustrated coefficient generator 41 comprises a first multiplier 411 for multiplying the local signal Lik by the error signal Erk to calculate a first product and to produce a first product signal indicative of the first product and a second multiplier 422 for calculating a second product of the first product signal and the step size signal S1 to produce a second product signal indicative of the second product. The second product signal is sent to an adder 423 which is supplied with a local delayed signal from a delay unit 424. Specifically, the adder 423 sums up the second product signal and the local delayed signal to deliver a sum signal to the delay unit 424 which delays the sum signal for a single clock interval, namely, a single sampling period to produce a delayed sum signal. The delayed sum signal is fed back to the adder 423 as the local delayed signal on one hand and is produced as the internal coefficient signal CIik. Such an operation of the coefficient generator 41 is known in the art and will not be described any longer.

Turning back to FIG. 2, the internal coefficient signal CIik is sent to a multiplication circuit 42 which is supplied with the local signal Lik. A product of the internal coefficient signal CIik and the local signal Lik is calculated by the multiplication circuit 42 and is produced as an i-th one of the calculated signals. In addition, the coefficient circuit $31_i$ further comprises a tap number memory 311 for storing a tap number signal in response to the matrix control signal Mc. The tap number signal is representative of an index to one of the first through the M-th coefficients assigned to the coefficient circuit and is sent to the control circuit 33 together with the internal coefficient signal CIik. A combination of the internal coefficient signal and the tap number signal will be often depicted as $Co_i$ hereinunder.

Figure 4:
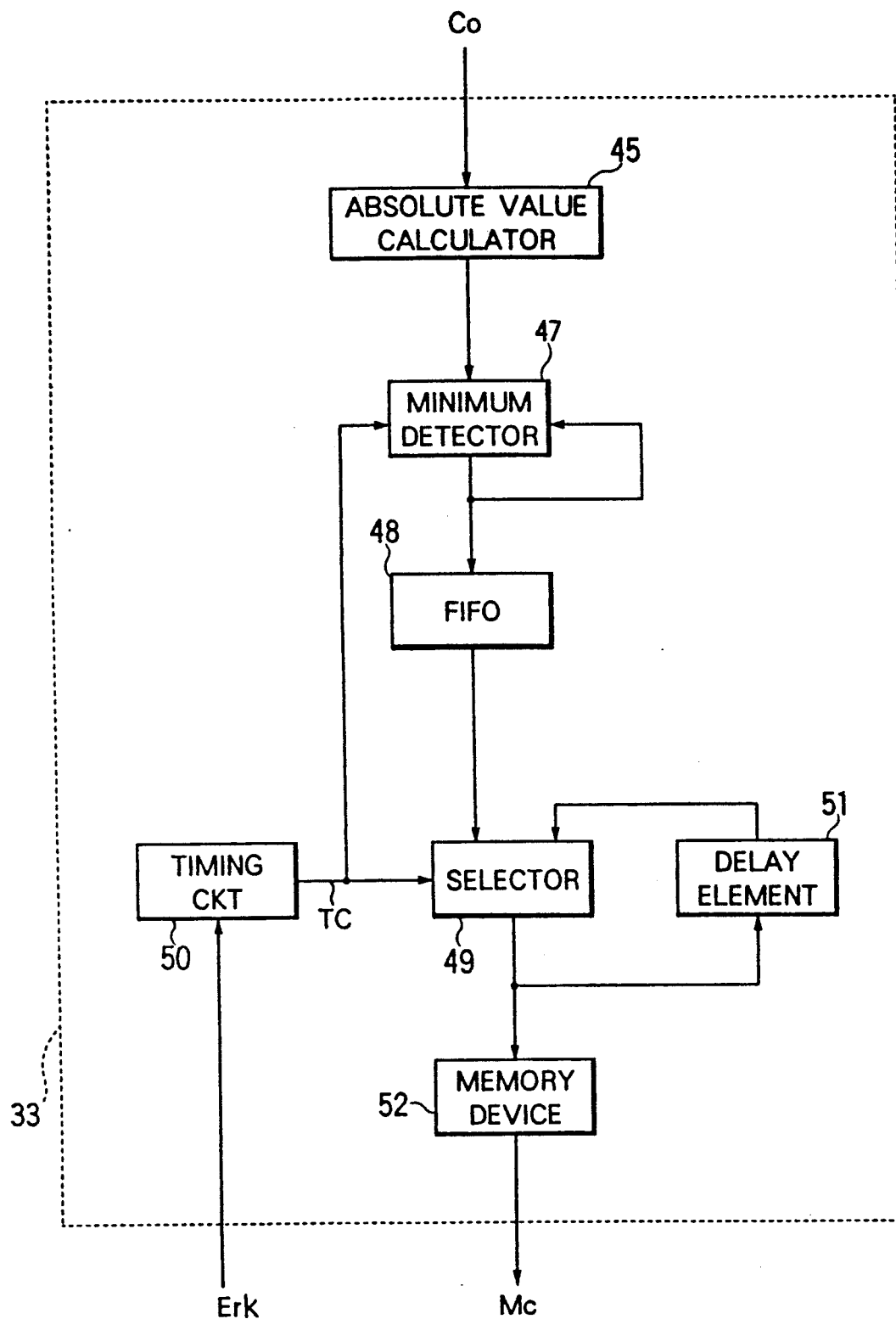
FIG. 4 is a block diagram of a control circuit used in the adaptive filter illustrated in FIG. 1.

Referring to FIG. 4 together with FIG. 2, the control circuit 33 is for use in supplying the matrix switch 32 with a matrix control signal in a manner to be described later and to adaptively select the first through the M-th taps from the first through the N-th taps. To this end, the control circuit 33 is supplied from the first through the M-th coefficient circuits $31_1$ to $31_M$ with the first through the M-th internal coefficient signals and the tap number signals, such as $Co_1$ to $Co_M$.

Herein, it is to be noted that there are two kinds of taps; active taps and inactive taps. To each active tap, a coefficient value or a coefficient circuit is assigned and contributes to filter output signal. Inactive taps are not assigned with any coefficient values and have nothing to do with the filter output signal. A set of active taps and a set of remaining inactive taps are equal in number to M and N-M, respectively. In addition, the first through the M-th internal coefficient signals have tap numbers assigned to the respective taps together with the coefficient values.

In FIG. 4, the first through the M-th internal coefficient signals Co (suffixes omitted) are successively delivered as a first set of the internal coefficient signals Co within the single sampling period from the first through the M-th coefficient circuits $31_1$ to $31_M$ to an absolute value calculator 45 of the control circuit 33. The absolute value calculator 45 successively calculates each absolute value of the first through the M-th internal coefficient signals to supply first through M-th ones of the absolute values to a minimum detector 47 as first through M-th absolute value signals, respectively.

The minimum detector 47 comprises a memory circuit and a comparator, as known in the art. The memory circuit memorizes the first through the M-th absolute value signals together with the tap numbers while the comparator compares the first through the M-th absolute value signals with one another to detect a minimum one of the first through the M-th absolute value signals and the tap number of the minimum absolute value signal. For convenience of description, the minimum absolute value signal will be depicted as Cjk and called a first minimum absolute value signal while the tap number which corresponds to the minimum absolute value signal and may be called a first minimum tap number is represented by Zj. In this event, the first minimum absolute value signal Cjk is selected from the first through the M-th absolute value signals. Therefore, such selection operation may be represented by:

$$Cjk = [Cmk | m = 1, 2, \ldots, \text{and } M|].$$

Subsequently, the first minimum tap number Zj is sent to a first-in first-out (FIFO) memory 48 on one hand and is fed back to the minimum detector 47 on the other hand. Supplied with the first minimum tap number Zj, the minimum detector 47 neglects the first minimum absolute value signal in response to the first minimum tap number Zj. As a result, a second minimum one of the absolute value signals is selected by the minimum detector 47 as a new Cjk from the absolute value signals of (M−1) in number together with a second minimum tap number as a new Zj assigned to the second minimum one of the absolute value signals. It should be noted that the "j" for the second minimum value and the corresponding number is different from the previous "j". Similar operation is repeated by the minimum detector 47 to determine the following minimum ones Cjk of the absolute value signals and the corresponding tap numbers Zj.

From this fact, it is readily understood that the minimum detector 47 successively produces the first minimum tap number, the second minimum tap number, and so on in order. Thus, the tap numbers are successively stored in the first-in first-out (FIFO) memory 48 from smaller ones of the tap numbers assigned to smaller ones of absolute value signals. The first-in first-out memory 48 has a plurality of stages arranged from a leading stage to a trailing stage and is operable to store each of the tap numbers in the form of a queue. Each of the tap numbers is stored in the trailing stage of the first-in first-out memory 48 while a memorized tap number is read out of the leading stage of the first-in first-out memory 48 to be sent to the selector 49 as a queue output signal. The memorized tap number is sent to a selector 49 which is controlled by a timing circuit 50 and which produces a selected signal in a manner to be described later.

The selector 49 is connected to a delay element 51 which serves to delay a selected signal for a single sampling period to produce a delayed signal. The delayed signal is fed back to the selector 49. At any rate, the selected signal is delivered from the selector 49 to a memory device 52 to be successively stored into the memory device 52.

In the illustrated example, the timing circuit 50 is supplied with the error signal Erk from the subtractor 26 (FIG. 1) to produce either a logic "1" level signal or a logic "0" level signal on the basis of the error signal Erk in a manner to be described later.

For a better understanding of the control circuit 33, description will be made about operation of the control circuit 33. Herein, M and N are equal to 3 and 7, respectively. Under the circumstances, it is assumed that the active tap numbers Z1, Z2, and Z3 are equal to 1, 3, and 6, and that the inactive tap numbers 2, 4, 5, and 7 are memorized in the first-in first-out memory 48. In addition, it is also assumed that the third output coefficient which corresponds to the third tap number 3 takes a minimum value. For brevity of description, it is surmised that the selector 49 always selects the memorized tap number sent from the first-in first-out memory 48.

In this case, the minimum detector 47 is given the first, the third, and the sixth tap numbers 1, 3, and 6 as the active tap numbers Z1, Z2, and Z3 together with the first, the third, and the sixth absolute value signals while the first-in first-out memory 48 memorizes the inactive tap numbers 2, 4, 5, and 7, as shown in a first row of Table 1.

TABLE 1

| Iterations | Operation | Z1 | Z2 | Z3 | FIFO |
|---|---|---|---|---|---|
| 0 | — | 1 | 3 | 6 | 2457 |
| 1 | Minimum Value Z1 | o | | | 2457 |
| 1 | Contents of Memory Device 52 | 1 | 2 | 6 | 4573 |
| 2 | Minimum Value Z1 | o | | | 4573 |
| 2 | Contents of Memory Device 52 | 4 | 2 | 6 | 5731 |

Inasmuch as the third output coefficient takes the minimum value, as mentioned before, the third tap number 3 is selected by the minimum detector 47 and sent to the trailing stage of the first-in first-out memory 48. As a result, the first-in first-out memory 48 is shifted forwards by a single stage to store the third tap number 3 after the tap number 7. Simultaneously, the second tap number 2 is shifted from the leading stage of the first-in first-out memory 48 to be sent through the selector 49 to the memory device 52 as the active tap number Z2. Thus, the second tap number 2 is substituted for the previous tap number 3 as the active tap number Z2 of the memory device 52.

Consequently, the memory device 52 stores the first, the second, and the sixth tap numbers 1, 2, and 6 as the active tap numbers Z1, Z2, and Z6, respectively, as illustrated in a second row of Table 1. In this connection, the first-in first-out memory 48 is loaded with the fourth, the fifth, the seventh, and the third tap numbers 4, 5, 7, and 3 as the inactive tap numbers. This shows that replacement or substitution of the tap numbers is carried out one time.

Thereafter, the minimum detector 47 detects a second minimum one of the active tap numbers from the remaining active tap numbers. The first tap number 1 is detected by the minimum detector 47 as a second minimum one of the active tap numbers that corresponds to a second minimum one of the output coefficients. In this event, the first tap number 1 is moved to the trailing stage of the first-in first-out memory 48 while the fourth tap number 4 is sent from the leading stage of the first-in first-out memory 48 to the memory device 52 through the selector 49. Thus, the memory device 52 stores the fourth, the second, and the sixth tap numbers 4, 2, and 6 as the active tap numbers, respectively, as illustrated in a third row of Table 1. Thus, substitution of the tap numbers is carried out two times.

Further referring to FIG. 4, the illustrated timing circuit 50 is supplied with the error signal Erk from the subtractor 26 (FIG. 1) to produce a timing control signal TC which takes either the logic "1" level or the logic "0" level. The timing control signal TC is delivered to the selector 49 and the minimum detector 47 and serves to determine a time interval for substitution of the tap numbers. More specifically, when the error signal has a large amplitude, the logic "1" level of the timing control signal TC lasts for a long time while the logic "0" level becomes short. On the other hand, when the error signal has a small amplitude, the logic "1" level of the timing control signal TC lasts for a short time while the logic "0" level lasts for a long time.

Responsive to the timing control signal TC, the selector 49 selects an output signal of the first-in first-out memory 48 when the timing control signal TC takes the logic "1" level. Otherwise, the selector 49 selects the delayed signal given from the delay element 51.

With this structure, the substitution of the tap numbers is carried out in the memory device 52 in cooperation with the minimum detector 47, the first-in first-out memory 48, and the selector 49 while the timing control signal TC takes the logic "1" level. Consequently, the tap numbers of the memory device 52 are successively substituted for the timing control signal TC of the logic "1" level in the above-mentioned manner.

On the other hand, while the timing control signal TC takes the logic "0" level, the selector 49 repeatedly selects the delayed signal. Therefore, the contents of the memory device 52 are kept unchanged for the timing control signal TC of the logic "0" level.

For example, let timing control signal TC may be changed from the logic "1" level to the logic "0" level in Table 1 after the substitution is carried out one time. In this event, the contents of the memory device 52 become (1, 2, 6), as readily understood from Table 1. This means that the matrix control signal Mc are sent to the first, the second, and the sixth taps to make them act as the active taps.

Likewise, the timing control signal TC may be changed from the logic "1" level to the logic "0" level in Table 1 after the substitution is carried out two times. The contents of the memory device 52 become (4, 2, 6). Therefore, the matrix control signal Mc is delivered to the fourth, the second, and the sixth taps.

From this fact, it is understood that the substitution number of the output coefficients or tap coefficients to be updated one time is adaptively controlled by the error signal. Specifically, when the error signal is large, a comparatively large number of the tap coefficients are changed from one to another. Otherwise, a small number of the tap coefficients alone are changed.

Figure 5:
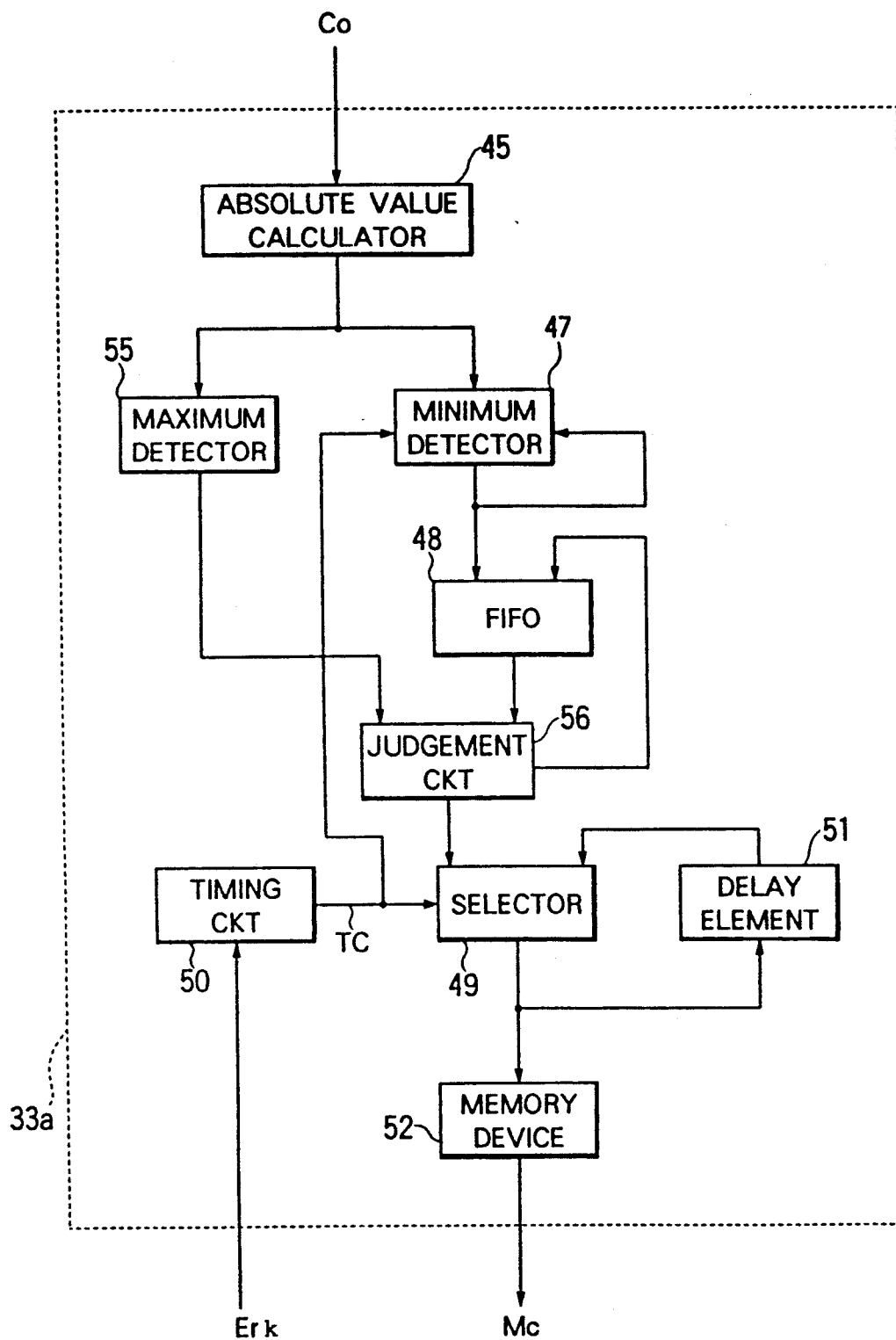
FIG. 5 is a block diagram of another control circuit used in an adaptive filter according to a second embodiment of this invention.

Referring to FIG. 5, a control circuit according to a second embodiment of this invention is somewhat different from that illustrated in FIG. 4 and is therefore depicted at 33a in FIG. 5. Specifically, the illustrated control circuit 33a can be substituted for the control circuit 33 illustrated in FIG. 1 and will be described with reference to FIG. 1 also hereinunder.

Specifically, the control circuit 33a comprises a maximum detector 55 and a judgement circuit 56 both of which are located between the absolute value calculator 45 and the selector 49. The maximum value calculator 55 is supplied with the first through the M-th absolute value signals together with the corresponding tap numbers Zj within the single sampling period, like the minimum detector 47. The maximum value calculator 55 detects a maximum one of the first through the M-th absolute value signals to produce a maximum tap number Zmax corresponding to the maximum absolute value signal. The maximum tap number is sent to the judgement circuit 56 together with a new tap number Znew which is produced from the first-in first-out memory 48 in the above-mentioned manner. In addition, the judgement circuit 56 internally produces a threshold Zth which is not smaller than $2M-1$.

The judgement circuit 56 calculates a difference between the maximum tap number Zmax and the new tap number Znew and thereafter compares the difference with the threshold Zth. When the difference is smaller than the threshold Zth, the new tap number Znew is sent to the selector 49. This means that the new tap number is close to the maximum tap number and that the adaptive filter is operable in the vicinity of a dispersive portion or a significant portion of an impulse response. In this case, the tap coefficients may be adaptively varied from one to another.

On the other hand, when the difference is not smaller than the threshold Zth, the new tap number Znew is fed back to the first-in first-out memory 48 to be set in the trailing stage of the first-in first-out memory 48. Instead, a following minimum absolute value signal is read out of the leading stage of the first-in first-out memory 48 in the above-mentioned manner and is sent as a renewed new tap number Znew to the judgement circuit 56. Such comparison of the threshold Zth and renewal of the new tap number Znew are repeated until the judgement circuit 56 judges that the difference is smaller than the threshold Zth to supply the new tap number Znew to the selector 49.

With this structure, the difference can be restricted to a range smaller than the threshold Zth. In other words, the memory device 52 stores either the new tap number Znew supplied to the selector 49 through the judgement circuit 56 or the delayed signal sent from the delay element 51 to the selector 49 only when either the above-mentioned new tap number Znew is close to the maximum tap number Zmax. From this fact, it is readily understood that a lot of active taps are concentratedly arranged in the vicinity of the maximum tap number.

Figure 6:
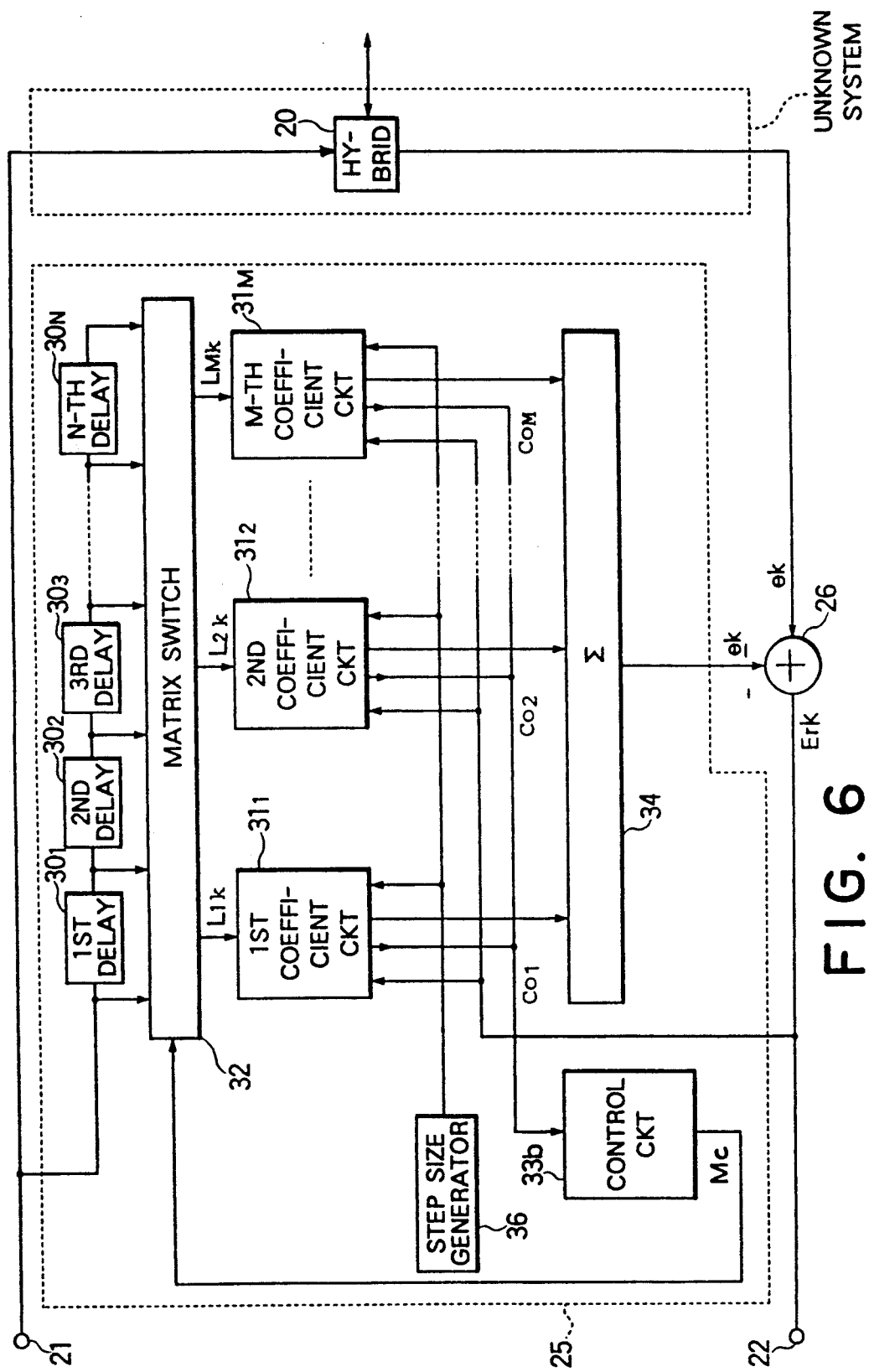
FIG. 6 is a block diagram of an adaptive filter according to a third embodiment of this invention.
Figure 7:
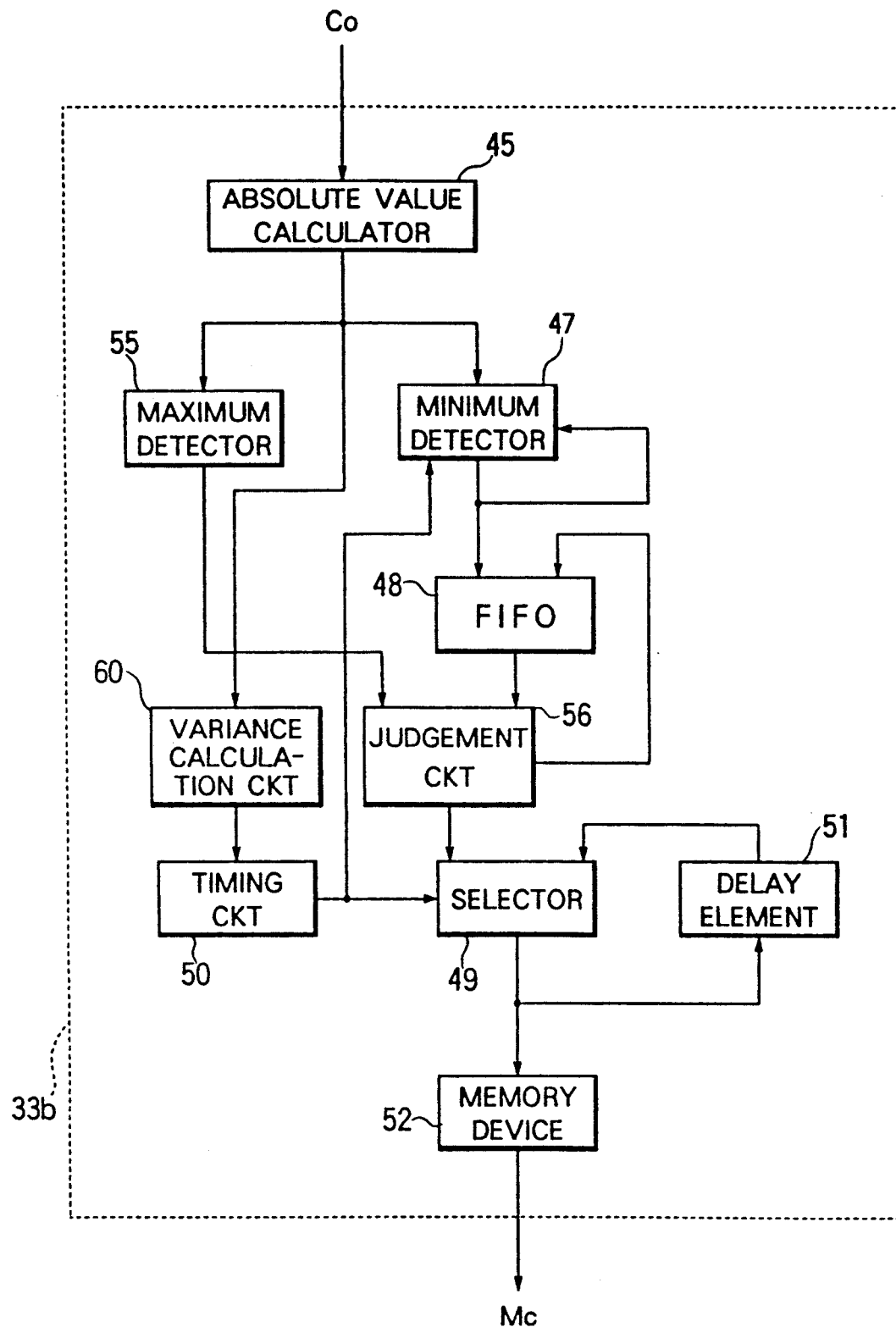
FIG. 7 is a block diagram of a control circuit applicable to the adaptive filter illustrated in FIG. 6.

Referring to FIGS. 6 and 7, an adaptive filter according to a third embodiment of this invention is similar to that illustrated in FIG. 1 except that the control circuit 33b of FIGS. 6 and 7 is not supplied with the error signal Erk from the subtractor 26. More specifically, the control circuit 33b produces the matrix control signal Mc in response to no error signal Erk. Instead, the control circuit 33b illustrated in FIG. 7 comprises a variance calculation circuit 60 which calculates a variance among the absolute value signals to produce a variance signal representative of the variance. The other parts and elements are similar to those illustrated in FIG. 5 and will not be described any longer.

In FIG. 7, the variance calculation circuit 60 comprises a memory section for successively storing the absolute value signals and a calculation section for calculating the variance among the absolute value signals and is known in the art. Accordingly, the variance calculation circuit 60 will not be described any longer. The variance signal is changed from one to another in accordance with the variance.

In this event, when the variance is small, the timing circuit 50 produces a long succession of the logic "1" level followed by a short succession of the logic "0" level. To the contrary, when the variance is large, the timing circuit 50 produces a short succession of the logic "1" level followed by a long succession of the logic "0" level. Inasmuch as the selector 49 selects output signals of the judgement circuit 56 while the timing control signal TC takes the logic "1" level, the contents of the memory device 52 are successively or frequently updated when the variance signal is small, namely, when the error signal is large. This means that the variance of the absolute values becomes large as the tap coefficients are concentratedly arranged at a tap portion corresponding to the dispersive portion of the impulse response and have been updated for enough number of iterations and that the variance is small as the tap coefficients are distributed all over and have small values.

Figure 8:
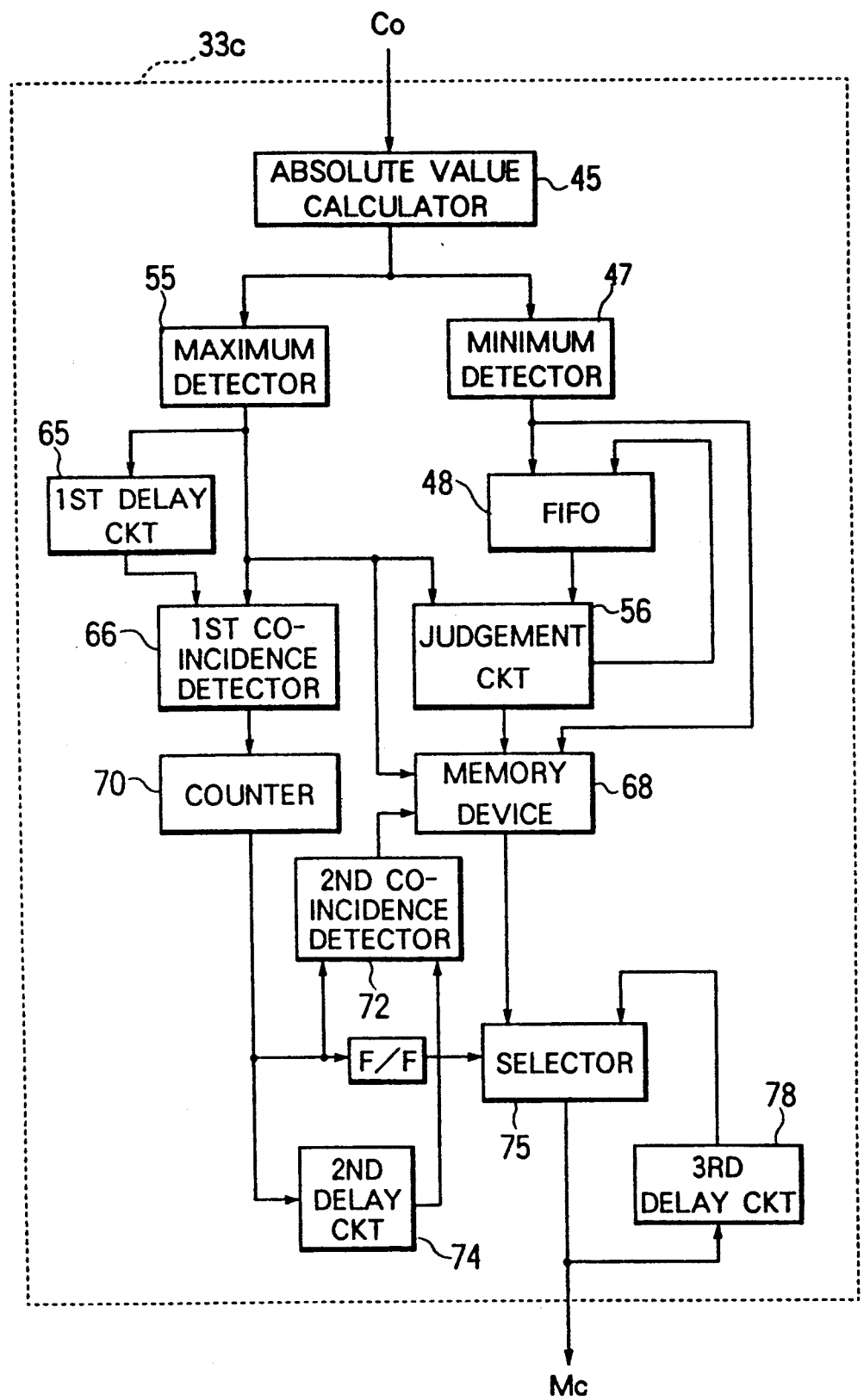
FIG. 8 is a block diagram of a control circuit applicable to an adaptive filter according to a fourth embodiment of this invention.

Referring to FIGS. 6 and 8, an adaptive filter according to a fourth embodiment of this invention is similar in structure to that illustrated in FIG. 6 except that a control circuit is different from that shown in FIG. 8 and is therefore depicted as 33c in FIG. 8. In other words, the control circuit 33c can be substituted for the control circuit 33b illustrated in FIG. 6.

In FIG. 8, the control circuit 33c comprises an absolute value circuit 45, a minimum detector 47, a first-in first-out memory 48, a maximum detector 55, and a judgement circuit 56, like in FIG. 7. In addition, the illustrated maximum detector 55 is connected to the judgement circuit 56 on one hand and to both of a first delay circuit 65 and a first coincidence detector 66 on the other hand. The first delay circuit 65 delays a maximum tap number Zmax for the single sampling period to produce a previous maximum tap number as a first delayed signal. For convenience of description, the maximum tap number may be called a provisional maximum tap number. The previous maximum tap number is delivered to the first coincidence detector 66 which is supplied with the provisional maximum tap number Zmax from the maximum detector 55. In the illustrated example, the provisional maximum tap number Zmax is delivered to both the judgement circuit 56 and a memory device 68. The judgement circuit 56 is operable in the manner mentioned in conjunction with FIG. 7 while the memory device 68 is operable in a manner to be described later.

In any event, the first coincidence detector 66 detects whether or not the provisional maximum tap number Zmax is coincident with the previous maximum tap number and produces the logic "1" level signal on detection of the coincidence between the provisional maximum tap number Zmax and the previous maximum tap number. Otherwise, the logic "0" level signal is produced from the first coincidence detector 66. A counter 70 is successively counted up in response to the logic "1" level signal to consecutively produce the logic "0" level as a counter output signal and is reset into the logic "0" level in response to the logic "0" level signal. In addition, the counter output signal of the logic "0" level is turned into the logic "1" level when the counter 70 is consecutively counted up to a predetermined value of, for example, ten or so.

The counter output signal is delivered to a second coincidence detector 72, a second delay circuit 74, and a selector 75 through a flip flop (unnumbered). The selector 75 selects either output signals of the memory device 68 or a delayed output signal of a third delay circuit 78 in accordance with the counter output signal in a manner to be mentioned later in detail. In addition, the illustrated memory device 68 has first through N-th addresses assigned to the first through the N-th taps, respectively. As mentioned before, the first through the N-th taps may be divided into the active taps, M in number, and the remaining inactive taps. Initially, the logic "1" level signals are loaded with first through M-th addresses which correspond to the active taps and which may be called first through M-th active taps, respectively. The first through the M-th active addresses are dispersed in the memory device 68 with an equidistance left therebetween in the memory device 68. The remaining addresses which correspond to the inactive taps and which may be referred to as inactive addresses are loaded with the logic "0" levels. As illustrated in FIG. 8, the memory device 68 is connected to both the judgement circuit 56 and the minimum detector 47.

In FIG. 8, the judgement circuit 56 is connected to the first-in first-out memory 48 and the maximum detector 55 like in FIG. 7. In this connection, the judgement circuit 56 is successively supplied with the maximum tap number Zmax and the leading stage of the first-in first-out memory 48, respectively. A difference between the maximum tap number Zmax and the inactive tap number is compared with the threshold Zth in the manner mentioned in conjunction with that illustrated in FIG. 7. Consequently, the judgement circuit 56 judges whether or not the difference between the maximum tap number Zmax and the inactive tap number falls within the threshold Zth. When the difference is smaller than the threshold Zth, the inactive tap number is sent to the memory device 68 as a renewed active tap number which corresponds to a renewal active address previously storing the logic "0" level signal. Supplied with the renewed active tap number, the memory device 68 rewrites the logic "0" level signal of the renewal active address into the logic "1" level signal.

On the other hand, the memory device 68 is supplied from the minimum detector 47 with the minimum tap number Zmin which corresponds to one of the active taps initially set in the memory device 68 and which specifies one of the active addresses. In this event, the logic "1" level signals memorized in the one of the active addresses is rewritten into the logic "0" level signal in response to the minimum tap number Zmin.

Thus, a total number of the logic "1" level signals memorized in the memory device 68 is always equal to M and is therefore kept unchanged in the illustrated example.

Further referring to FIG. 8, a final maximum one of the tap coefficients is determined together with the corresponding tap number to find the dispersive or the significant portion of the impulse response. For this purpose, the maximum detector 55 successively detects, from the first through the M-th absolute values, the maximum absolute value and the corresponding tap number which will be called a provisional maximum absolute value and a provisional maximum tap number, respectively. The provisional maximum tap number is sent to the judgement circuit 56 and processed in the above-mentioned manner and is also sent to the memory device 68 to be processed in a manner to be described later.

The provisional maximum tap number is also supplied to both the first delay circuit 65 and the first coincidence detector 66, as mentioned before. The provisional maximum tap number is delayed by the first delay circuit 65 for the single sampling period to be sent to the first coincidence circuit 66 as the previous maximum tap number, as mentioned before.

On detection of the coincidence between the provisional maximum tap number and the previous maximum tap number, the first coincidence detector 66 supplies the logic "1" level signal to the counter 70. As long as the coincidence is being detected by the first coincidence detector 66, the counter 70 is counted up one by one to the predetermined value with the counter output signal kept at the logic "0" level, as described before. When the count reaches the predetermined value, the counter 70 delivers the second coincidence detector 72 and the second delay circuit 74 to the counter output signal of the logic "1" level Thereafter, when incoincidence is detected by the first coincidence detector 66 and the logic "0" level signal is given from the first coincidence detector 66 to the counter 70, the counter output signal is changed or turned into the logic "0" level. It is to be noted that such change of the counter output signal from the logic "1" level to the logic "0" level shows detection of the final maximum tap number.

In the illustrated example, the second coincidence detector 72 produces the logic "1" level signal when coincidence is detected between the counter output signal and a delayed counter output signal and, otherwise, the second coincidence detector 72 produces the logic "0" level signal. The detection of coincidence in the second coincidence detector 72 represents either a prior or a post state of detection of the final maximum tap number while the detection of incoincidence in the second coincidence detector 72 represents detection of the final maximum tap number.

When the final maximum tap number is determined by the second coincidence detector 72 by detection of the incoincidence, the memory device 68 is put into an enable state. Specifically, the address which corresponds to the final maximum tap number is accessed as a final maximum tap address together with (2M−1) addresses which are located before and after the final maximum tap address. Thus, the tap addresses, 2M in number, are accessed as renewal tap addresses. Thereafter, the logic "1" level signals are written into the renewal tap addresses which are located on both sides of the final maximum tap address with an equidistance left therebetween. By this operation, the active taps which are specified by the logic "1" levels are concentratedly arranged at a portion adjacent to the dispersive portion of the impulse response. Thus, an arrangement of the logic "1" levels and the logic "0" levels is sent to the selector 75 which is controlled by the counter output signal sent from the counter 70.

The selector 75 selects the output signals of the memory device 68 and the output signal of the third delay circuit 78 when the counter output signal takes the logic "0" level and the logic "1" level, respectively. More specifically, when the counter output signal of the logic "0" level is given through the flip flop to the selector 75, the selector 75 selects the output signals of the memory device 68 to produce them as the matrix control signal Mc. This shows that the tap coefficients are variable in accordance with the output signals of the memory device 68. On the other hand, when the counter output signal of the logic "1" level is given to the selector 75, the selector 75 produces, as the matrix control signal Mc, the delayed output signal sent from the third delay circuit 78. As long as the delayed output signal is selected by the selector 75, the tap coefficients are kept unchanged.

While the counter output signal takes the logic "0" level, the active taps are invariable and the initial states are kept unchanged. In addition, it is possible to substantially estimate the dispersive portion by monitoring growth of amplitudes of the tap coefficients. Production of the counter output signal of the logic "1" level suggests that the dispersive portion has been substantially estimated. In this event, the active taps are concentratedly located in the vicinity of the estimated dispersive portion and the tap coefficients are finely given to the active taps.

Figure 9:
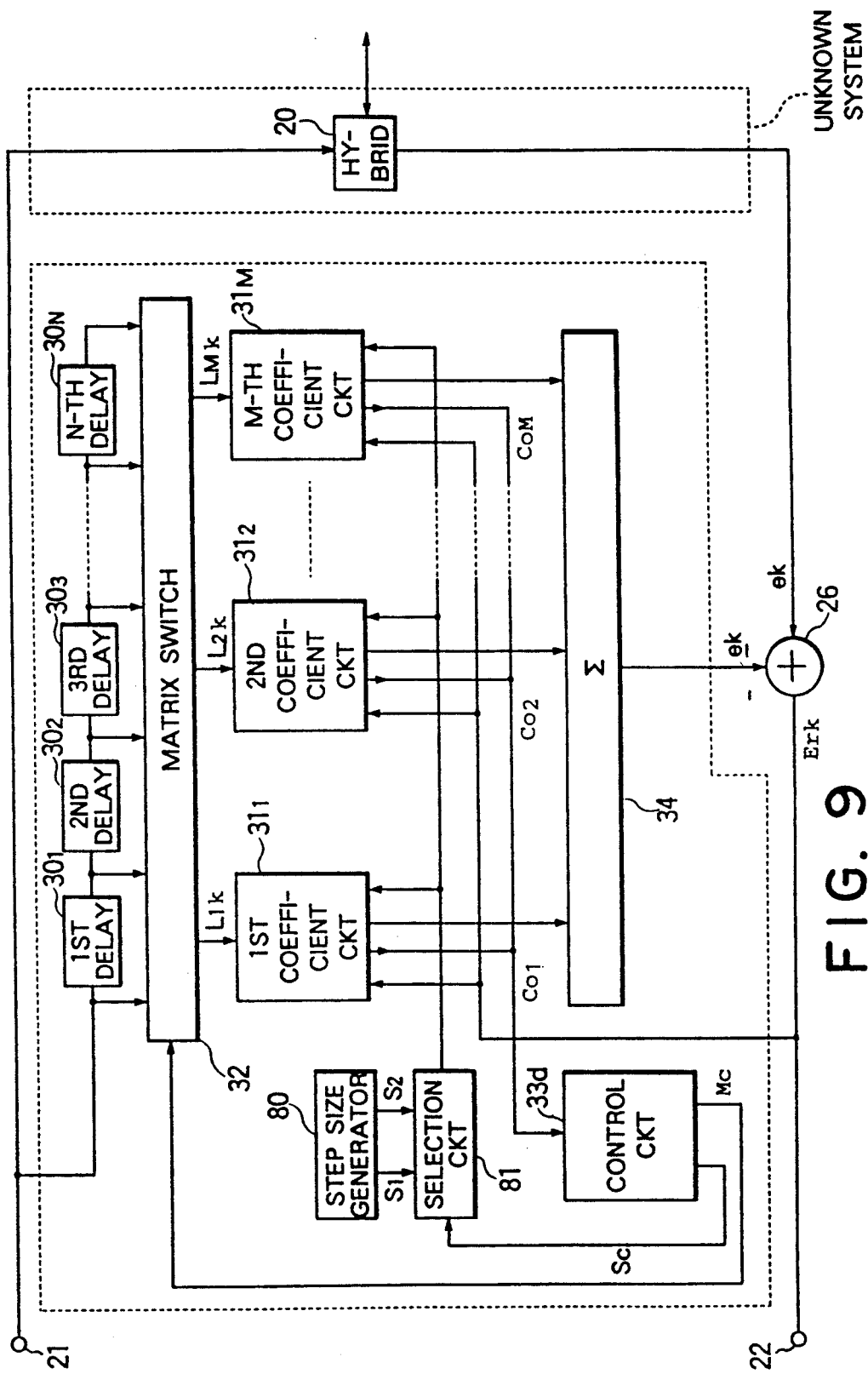
FIG. 9 is a block diagram of an adaptive filter according to a fifth embodiment of this invention.
Figure 10:
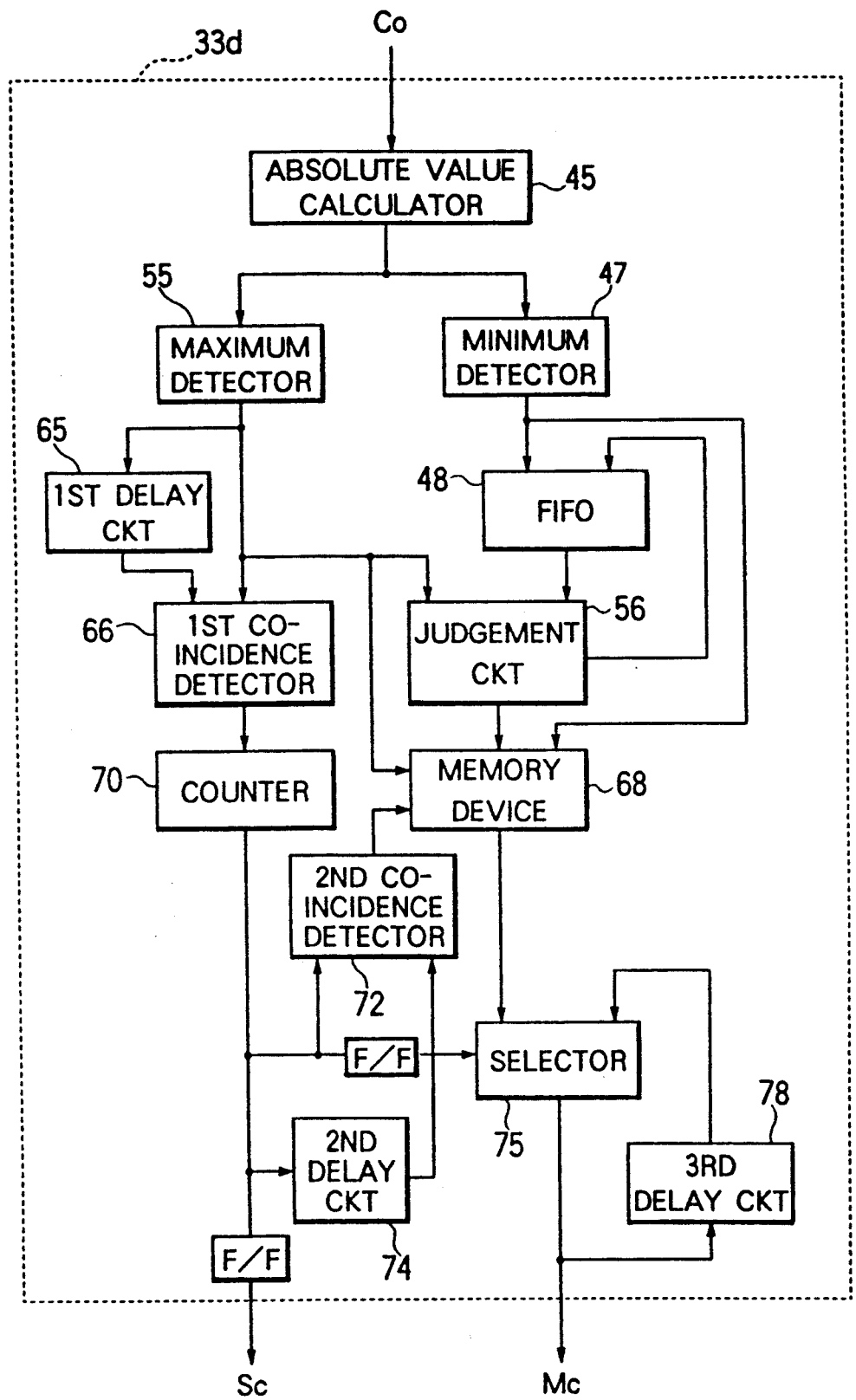
FIG. 10 is a block diagram of a control circuit applicable to the adaptive filter illustrated in FIG. 9.

Referring to FIGS. 9 and 10, an adaptive filter according to a fifth embodiment of this invention is different from that illustrated in FIG. 6 in the light of the fact that first and second step-sizes S1 and S2 are changed from one to another by a selector circuit 81 controlled by a control circuit depicted at 33d in FIG. 9. Herein, the first step-size S1 is not greater than the second step-size S2. The first and the second step-sizes S1 and S2 are produced by a step-size generator 80 to be selected by a selection circuit 81. Thereafter, the first and the second step-sizes are selectively delivered to the first through the M-th coefficient circuits $31_1$ to $31_M$ through the selection circuit 81 which is controlled by a selection control signal Sc sent from the control circuit 33d.

In FIG. 10, the control circuit 33d is similar in structure and operation to the control circuit 33c except that the counter output signal is produced as the selection control signal Sc from the counter 70 through a flip flop (unnumbered). When the counter output signal of the logic "0" level is supplied from the control circuit 33d to the selection circuit 81 as the selection control signal Sc, the selection circuit 81 selects the first step-size S1 and delivers the same to the respective coefficient circuits $31_1$ to $31_M$.

This shows that a small step-size is selected by the selection circuit 81 during search of the dispersive portion of the impulse response and that a large step-size is sent to the coefficient circuits after the dispersive portion has been found. Therefore, the tap coefficients stably grow up while the first step-size is selected. This serves to correctively estimate the dispersive portion. On the other hand, selection of the second step-size S2 serves to converge the tap coefficients into optimum valves at a high speed.

Figure 11:
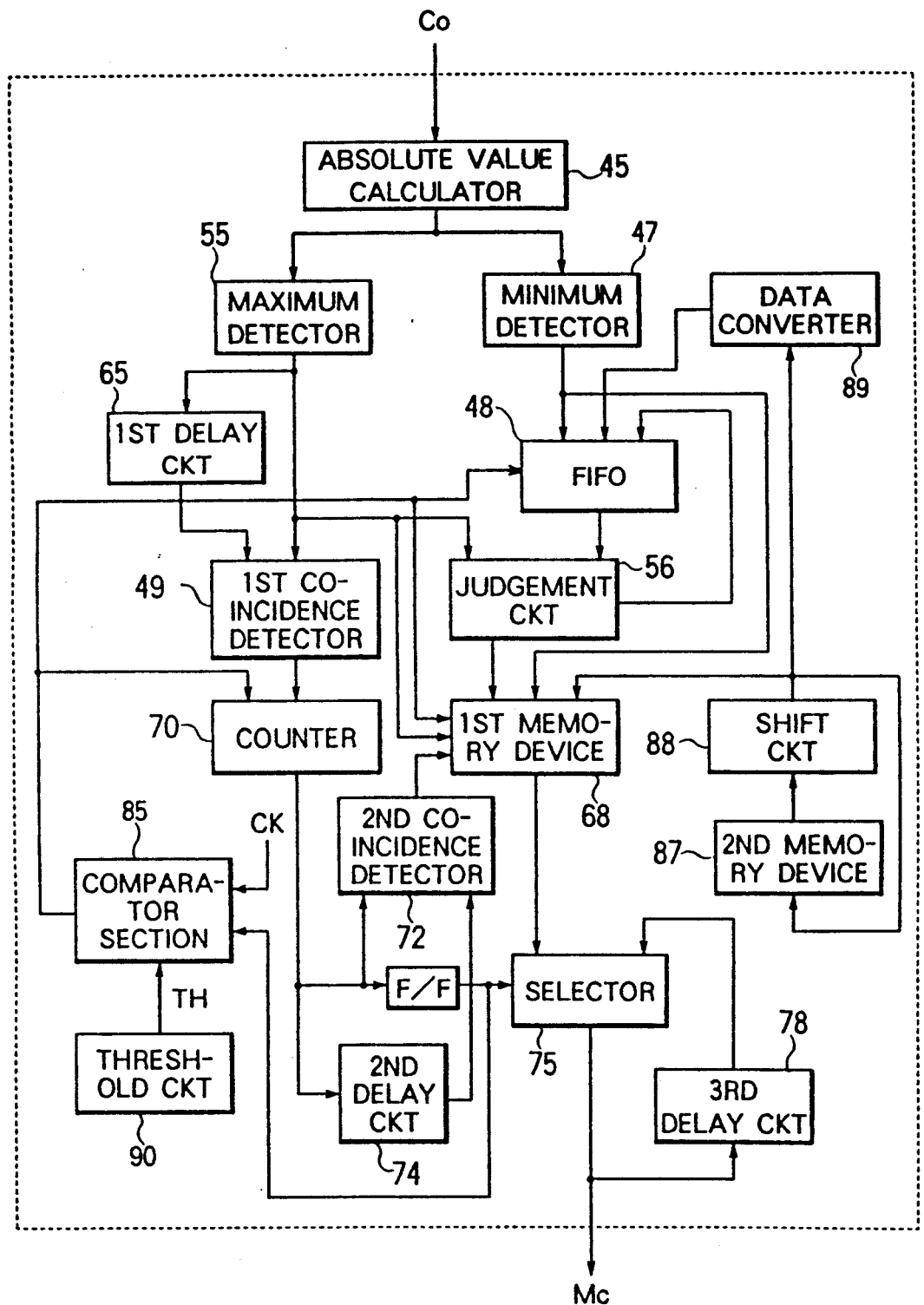
FIG. 11 is a block diagram of a control circuit for use in an adaptive filter according to a sixth embodiment of this invention.

Referring to FIG. 11, an adaptive filter according to a sixth embodiment of this invention is similar to that illustrated in FIG. 6 except that a control circuit 33e is different in structure and operation from the control circuit 33b and can be substituted for the latter. Accordingly, description will be made about the control circuit 33e, referring to FIG. 6 also.

In FIG. 11, the control circuit 33e comprises similar parts which are designated by like reference numerals and symbols in FIG. 8 and which are operable in the manner mentioned in conjunction with FIG. 8. In addition, the illustrated control circuit 33e is operable to renew or update initial active-tap assignment from one to another when the initial assignment is unsuitable for estimating the unknown system within a preselected duration.

For this purpose, the control circuit 33e comprises a comparator section 85, an additional memory device 87, a shift circuit 88, and a data converter 89. In FIG. 11, the memory device 68 and the additional memory device 87 will be called first and second memory devices, respectively. Specifically, the comparator section 85 is connected to the counter 70 through the flip flop, the first-in first-out memory 48, the first memory device 68, and a threshold circuit 90 for producing a threshold value TH. The comparator section 85 comprises a counter unit enabled while the counter 70 produces the logic "0" level signal. The counter unit counts a sequence of clock pulses CK during the enabled state to produce a count. The illustrated comparator section 85 further comprises a comparator unit for comparing the count with the threshold value TH to produce a reset signal when the count becomes equal to the threshold value TH. The reset signal is delivered to the counter 70, the first-in first-out memory 48, and the first memory device 68 to put them into reset or initial states. Production of the reset signal means that the dispersive portion of the impulse response has not been estimated for the preselected duration determined by the clock pulses and the threshold values TH. The above-mentioned counter unit itself is reset when the logic "1" level signal is sent from the counter 70 to the comparator section 85 through the flip flop.

Herein, it is to be noted here that a maximum absolute value may be scarcely detected by the maximum detector 55 for a long time outside of the dispersive portion of the impulse response or none of the initial active-tap assignment coincide with one of the three active-tap portions. Accordingly, the comparator section 85 measures an incoincidence duration of the first coincidence detector 49. When the incoincidence duration becomes long, it is judged that the initial active-tap assignment in the first memory device 68 and the first-in first-out memory 48 are unsuitable for estimating the dispersive portion in the unknown system. Thereafter, the initial assignment is changed from one to another in a manner to be described later in detail.

As mentioned before, the counter 70, the first-in first-out memory 48, and the first memory device 68 are put into reset states when the count becomes equal to the threshold value TH. Under the circumstances, the initial states or contents of the first-in first-out memory 48 and the first memory device 68 are rewritten into additional initial contents. To this end, the second memory device 87 memorizes the initial contents of the first memory device 68. The initial contents are formed by a combination of N bits composed of the logic "1" levels, M in number, and the remaining logic "0" levels. The logic "1" levels are dispersed at an equidistance in N bits, as mentioned before, and positions of the logic "1" levels specify locations of the active taps. To the contrary, positions of the logic "0" levels specify locations of the inactive taps.

When the first memory device 68 is reset together with the first-in first-out memory 48 in the above-mentioned manner, the shift circuit 88 is operated to shift the initial contents of N bits by a shift amount into shifted contents. The shift amount is equal to a half of N bits. The shifted contents are delivered to the first memory device 68 to be set therein and to specify the active taps. On the other hand, the shifted contents are also delivered to the data converter 89 to specify the inactive taps to be memorized in the first-in first-out memory 48. In this connection, the data converter 89 inverts the shifted contents sent from the shift circuit 88 and supplies only the indices of the bits with the logic "1" level to the first-in first-out memory 48. Thus, the inactive taps are specified by the indices memorized in the first-in first-out memory 48.

Such a shift operation of the shift circuit 88 is repeated each time when each of the first-in first-out memory 48 and the first memory device 68 is reset. The shift amount is successively reduced to a half of a previous shift amount in each shift operation. Such a change of the shift amount is repeated until it becomes equal to a single sample.

With this structure, it is possible to quickly estimate the dispersive portion of the impulse response by changing the active taps with the number of the active taps kept unchanged. When the dispersive portion has been estimated, the counter 70 produces the logic "1" level signal and thereafter the logic "0" level signal. The second coincidence detector 72 detects incoincidence of the logic "1" level signal and the logic "0" level signal to put the first memory device 68 into the enable state. Subsequently, operation is carried out in the first memory device 68 in the manner mentioned in conjunction with FIG. 8 and will not be described any longer.

Figure 12:
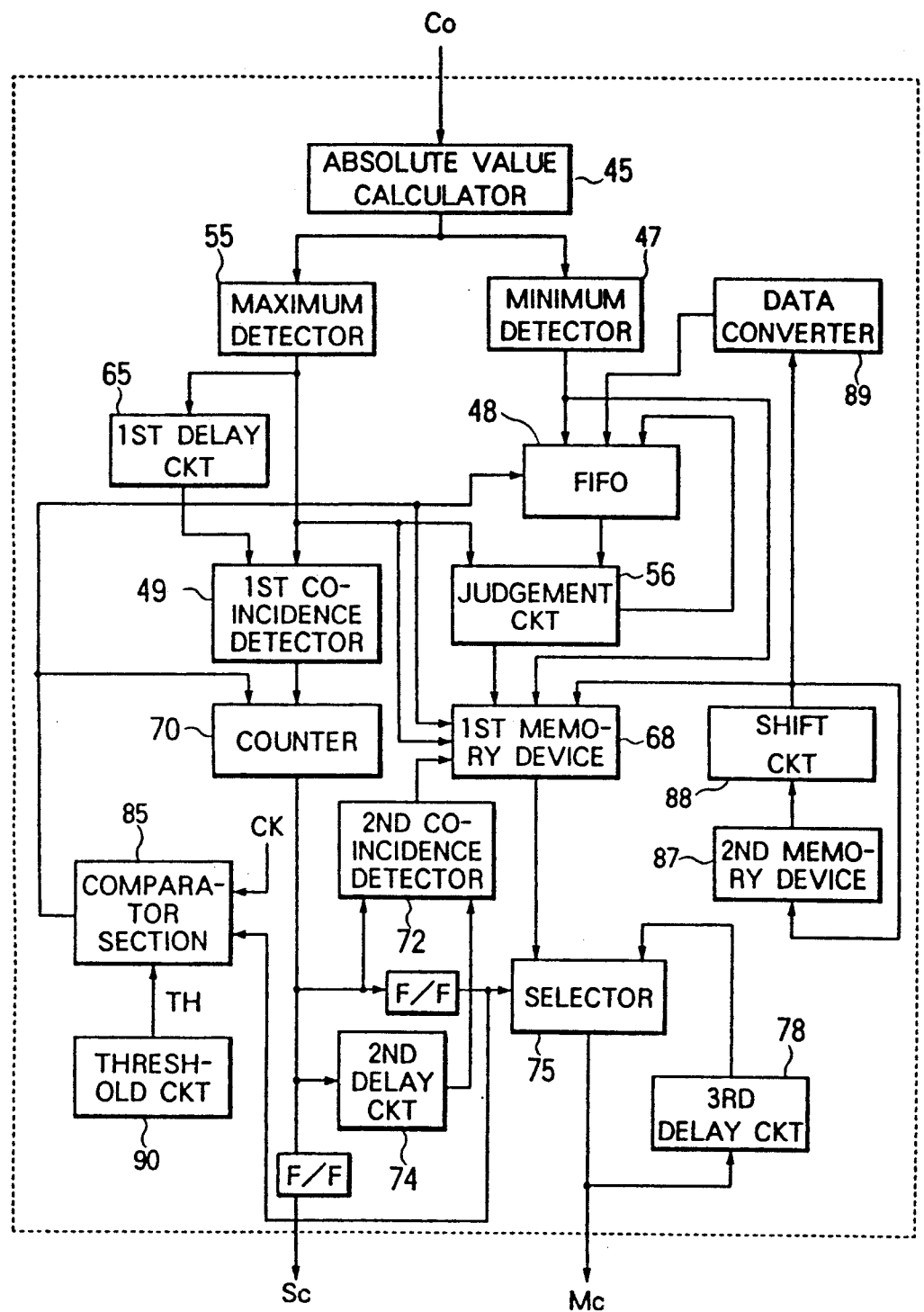
FIG. 12 is a block diagram of a control circuit for use in an adaptive filter according to a seventh embodiment of this invention.

Referring to FIG. 12 together with FIG. 9, an adaptive filter according to a seventh embodiment of this invention comprises a control circuit 33f which is similar in structure and operation to that illustrated in FIG. 11 except that the counter output signal is delivered as the step-size control signal Sc to the selection circuit 81, as shown in FIG. 9. Like in FIG. 9, the counter output signal of the logic "0" level serves to select the first step-size S1 in the selection circuit 81 while the counter output signal of the logic "1" level serves to select the second step-size S2.

Figure 13:
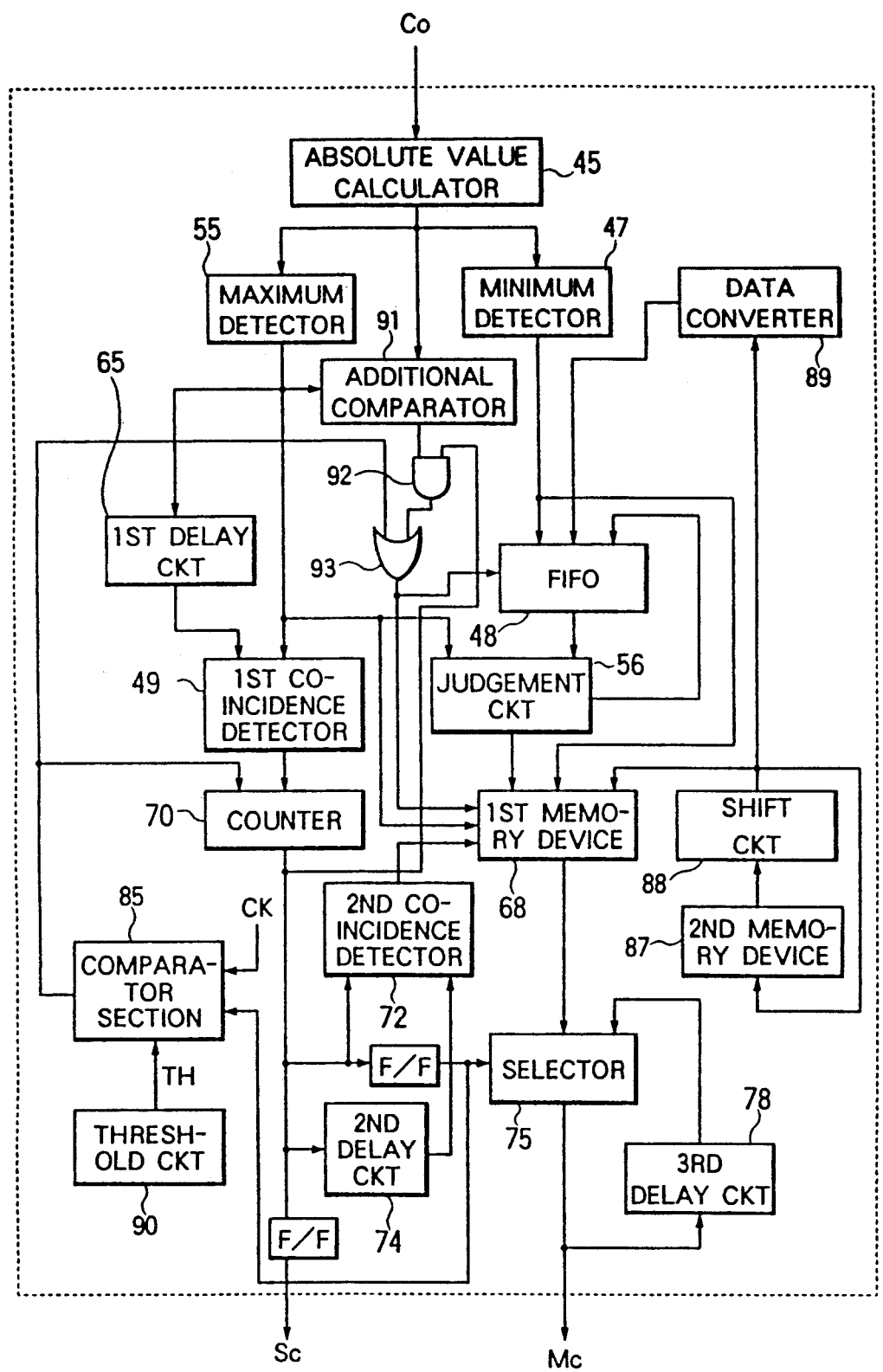
FIG. 13 is a block diagram of a control circuit for use in an adaptive filter according to an eighth embodiment of this invention.

Referring to FIG. 13, an adaptive filter according to an eighth embodiment of this invention is specified by a control circuit 33g which comprises similar parts designated by like reference numerals and symbols. In FIG. 13, a tap arrangement is not concentrated while the provisional maximum absolute value is not sufficiently large in comparison with the other absolute values and the dispersive portion is continuously searched. To this end, the illustrated control circuit 33g comprises an additional comparator 91 connected to the absolute value calculator 45, an AND circuit 92 connected to the additional comparator 91 and the counter 70, and an OR circuit 93 connected to the AND circuit 92 and the comparator 85.

The additional comparator 91 compares the provisional maximum absolute value with each of the absolute values sent from the absolute value calculator 45. In this event, the additional comparator 91 can carry out such comparison in various manners. For example, a ratio of the provisional maximum absolute value to a second maximum one of the absolute values can be used to judge whether or not the provisional maximum absolute value is sufficiently large. When the above-mentioned ratio is used, the additional comparator 91 compares the ratio with a prescribed threshold value. If the ratio is greater than the prescribed threshold value, the provisional maximum absolute value may be judged to be sufficiently large. Taking this into consideration, the additional comparator 91 produces, as a comparator output signal, the logic "0" level signal when the ratio is sufficiently large and, otherwise, produces the logic "1" level signal. The comparator output signal is sent to the AND circuit 92 connected to the counter 70. As described above, the counter 70 supplies the AND circuit 92 with the logic "1" level signal when the same provisional maximum tap number for the provisional maximum absolute value repeatedly appears the predetermined times. Therefore, the AND circuit 92 sends the logic "1" level signal to the OR circuit 93 when both the additional comparator 91 and the second coincidence detector 72 produces the logic "1" level signals. Namely, the AND circuit 92 is opened when the provisional maximum tap number is repeated the predetermined times but the provisional maximum absolute value is not sufficiently large. Otherwise, the AND circuit 92 produces the logic "0" level signal.

At any rate, an output signal of the AND circuit 92 is delivered to the OR circuit 93 together with the output signal of the comparator 85. The OR circuit 93 supplies the logic "1" level signal to the first memory device 68 when either one of the output signals of the AND circuit 92 and the comparator 85 produces the logic "1" level signal. Supplied from the OR circuit 93 with the logic "1" level signal, the first memory device 68 is cleared to be renewed by the use of the second memory device 87 and the shift circuit 88 in the above-mentioned manner.

From this fact, it is readily understood that the first memory device 68 is cleared when the dispersive portion can not be suitably estimated in spite of the fact that the tap coefficients are renewed the predetermined times or when the provisional maximum absolute value is not sufficiently large.

After the first memory device 68 is cleared, the contents of the first memory device 68 and the first-in first-out memory 48 are concurrently renewed or updated into fresh initial states. Estimation of the dispersive portion is started again by the use of the fresh initial states in the manner mentioned above.

While this invention has thus far been described in conjunction with several embodiments thereof, it will readily be possible for those skilled in the art to put this invention into practice in various other manners. For example, a combination of the first coincidence detector 49 and the counter 70 may be replaced by a probability calculation circuit for calculating a probability in lieu of counting the coincidence times. In addition, this invention is applicable to all of unknown systems which exhibit an impulse response having a flat delay portion and a dispersive portion. Although the LMS algorithm is used in each adaptive filter of the above-mentioned examples, any other algorithm, such as LIM algorithm may be used.

What is claimed is:

1. An adaptive filter for use in identifying an unknown system by responding to an input signal and an echo signal which results from said input signal and which is sent from said unknown system and by producing an error signal appearing as a result of identification of said unknown system, said input signal being given to said adaptive filter in the form of a sequence of sampled input signals each of which is sampled at every one of sample periods, said adaptive filter comprising first through N-th delay elements connected in series to one another to define first through N-th taps for successively delaying said sampled input signals by every one of said sample periods to produce first through N-th delayed signals through said first through said N-th taps, respectively, where N is a natural number, processing means supplied with said first through said N-th delayed signals for processing said first through said N-th delayed signals to produce an echo replica signal representative of a replica of said echo signal, and subtracting means for subtracting said echo replica signal from said echo signal to produce said error signal; said processing means comprising:

a controllable matrix switch supplied with said first through said N-th delayed signals and with a switch control signal for selectively switching said first through said N-th taps to select first through M-th taps from said first through said N-th taps to produce said first through said M-th ones of said delayed signals as first through M-th local signals where M is a natural number not greater than N;

first through M-th calculation means supplied with said first through said M-th local signals for carrying out calculations between first through M-th coefficient signals representative of first through M-th coefficients and said first through said M-th local signals to obtain first through M-th calculated results and to produce first through M-th calculated signals which are representative of said first through said M-th calculated results, respectively;

summing means for summing said first through said M-th calculated signals to produce said echo replica signal;

control means coupled to said first through said M-th calculation means and said controllable matrix switch for controlling said controllable matrix switch to adaptively replace the first through the M-th taps into first through M-th renewed taps by monitoring the first through the M-th coefficient signals and said error signal and to thereby produce a tap control signal representative of said first through said M-th renewed taps; and means for supplying said tap control signal to said matrix switch as said matrix control signal.

2. An adaptive filter as claimed in claim 1, wherein said control means comprises:

timing means for monitoring said error signal to define a time interval for replacing said first through said M-th taps into said first through said M-th renewed taps;

tap calculating means supplied with said first through said M-th coefficient signals and with said first through said M-th taps for calculating each of said first through said M-th renewed taps;

delaying means for delaying said first through said M-th taps; and replacing means coupled to said timing means, said tap calculating means, and said delaying means for successively replacing each of said first through said M-th renewed taps only during said time interval to produce said tap control signal and, otherwise, for selecting said first through said M-th taps sent from said delaying means to produce the same as said tap control signal.

3. An adaptive filter as claimed in claim 2, wherein said tap calculating means comprises:

absolute value means for calculating absolute values of said first through said M-th coefficients to produce a set of absolute value signals representative of said absolute values;

minimum value calculating means for calculating a minimum one of said absolute values to successively produce said absolute value signals from the minimum one in order together with the corresponding tap numbers as rearranged absolute value signals along with rearranged tap numbers corresponding to said rearranged absolute value signals; and a first-in first-out memory having leading through trailing stages for successively memorizing said rearranged tap numbers to supply said rearranged tap numbers one by one from said leading stage and to indicate each of said first through said M-th renewed taps.

4. An adaptive filter as claimed in claim 2, wherein said tap calculating means comprises:

absolute value means for calculating absolute values of said first through said M-th coefficients to produce a set of absolute value signals representative of said absolute values;

minimum value calculating means for calculating a minimum one of said absolute values to successively produce said absolute value signals from the minimum one in order together with the corresponding tap numbers as rearranged absolute value signals along with rearranged tap numbers corresponding to said rearranged absolute value signals;

a first-in first-out memory having leading through trailing stages for successively memorizing said rearranged tap numbers to supply said rearranged tap numbers one by one from said leading stage and to indicate a new tap number which may be assigned to one of said first through said M-th renewed taps;

maximum value calculating means for calculating a maximum one of said absolute values and a maximum one of said first through said M-th taps corresponding to said maximum one of the absolute values to produce a maximum tap number signal representative of a maximum tap number assigned to said maximum one of the first through the M-th taps; and judging means supplied with said new tap number and said maximum tap number for judging whether or not a difference between said new tap number and said maximum tap number falls within a predetermined range to produce said new tap number only when said difference falls within said predetermined range and to indicate said new tap number as one of said first through said M-th renewed taps to said replacing means.

5. An adaptive filter as claimed in claim 1, said selected one of the first through the M-th coefficient signals and said error signal being the first through the M-th coefficient signals, wherein said control means comprises:

absolute value means for calculating absolute values of said first through said M-th coefficients to produce a set of absolute value signals representative of said absolute values;

variance calculating means supplied with the set of the absolute value signals for calculating a variance among the set of the absolute value signals to produce a variance signal representative of said variance;

timing means for monitoring said variance signal to define a time interval for replacing said first through said M-th taps into said first through said M-th renewed taps;

tap calculating means supplied with said first through said M-th coefficient signals and with said first through said M-th taps for calculating each of said first through said M-th renewed taps;

delaying means for delaying said first through said M-th taps; and replacing means coupled to said timing means, said tap calculating means, and said delaying means for successively replacing each of said first through said M-th renewed taps only during said time interval to produce said tap control signal and, otherwise, for selecting said first through said M-th taps sent from said delaying means to produce the same as said tap control signal.

6. An adaptive filter as claimed in claim 1, said first through said N-th taps being divisible into active and inactive taps, said control means being for monitoring the first through the M-th coefficient signals as said selected one of the first through the M-th coefficient signals and said error signal, the first through the M-th coefficient signals being sent from said active taps, wherein said control means comprises:

memory means having first through N-th addresses corresponding to said first through said N-th taps for memorizing first through M-th active tap signals indicative of said active taps and the remaining inactive tap signals indicative of the inactive taps, said first through said M-th active tap signals being dispersed in said memory means;

maximum tap value detecting means for detecting a maximum coefficient signal from said first through said M-th coefficient signals together with a maximum tap number corresponding to said maximum coefficient signal over a plurality of the sample periods; and means coupled to said memory means and said maximum tap value detecting means for writing the active tap signals into both a specific one of the addresses of said memory means assigned to said maximum tap number and a plurality of the addresses adjacent to said specific address when said maximum coefficient signal is detected by said maximum tap value detecting means.

7. An adaptive filter as claimed in claim 6, wherein said maximum tap value detecting means comprises:

absolute value calculating means for calculating absolute values of said first through said M-th coefficients to successively produce a set of absolute value signals representative of said absolute values and an additional set of tap number signals representative of tap numbers corresponding to said absolute values;

maximum detecting means supplied with each set of said absolute value signals for successively detecting a provisional maximum absolute value signal and a provisional maximum tap number signal corresponding to said provisional maximum absolute value signal from each set and each additional set to successively produce said provisional maximum tap number signal;

delaying means successively supplied with said provisional maximum tap number signal for delaying said provisional maximum tap number signal to produce a delayed maximum tap number signal;

first coincidence detecting means for detecting coincidence between said provisional maximum tap number signal and said delayed maximum tap number signal to produce a coincidence signal representative of said coincidence;

counting means for successively counting said coincidence signal to a predetermined count to produce a predetermined logic signal; and detecting means for detecting said maximum tap number in response to said predetermined logic signal.

8. An adaptive filter as claimed in claim 7, said first through said M-th calculation means being operable in accordance with a predetermined algorithm which uses a step size, said adaptive filter further comprising:

step size generating means for producing, as said step size, a first step size and a second step size greater than said first step size; and selection means operable in response to a selection signal for switching said first and said second step sizes from one to another;

said maximum tap value detecting means further comprising:

supplying means coupled to said counting means and said selection means for supplying said predetermined logic signal to said selection means as said selection signal to make said selection means switch from said first step size to said second step size.

9. An adaptive filter as claimed in claim 7, wherein said control means further comprises:

measuring means coupled to said detecting means of said maximum tap value detecting means for measuring no detection of said maximum coefficient signal for a preselected interval of time to produce an undetection signal indicative of said no detection of the maximum coefficient signal after lapse of said preselected interval of time; and delivering means for delivering said undetection signal to said memory means and said counting means as a reset signal to put them into reset states.

10. An adaptive filter as claimed in claim 9, wherein said control means further comprises:

substituting means coupled to said memory means for substituting a set of refreshed active tap signals for said first through said M-th active tap signals on production of said undetection signal.

11. An adaptive filter as claimed in claim 9, wherein said substituting means comprises:

additional memory means for memorizing an initial set of said first through said M-th active tap signals; and shifting means for shifting said initial set of the first through the M-th active tap signals to produce said set of the refreshed active tap signals.

12. An adaptive filter as claimed in claim 11, said first through said M-th calculation means being operable in accordance with a predetermined algorithm which uses a step size, said active filter further comprising:

step size generating means for producing, as said step size, a first step size and a second step size greater than said first step size; and selection means operable in response to a selection signal for switching said first and said second step sizes from one to another;

said maximum tap value detecting means further comprising:

supplying means coupled to said counting means and said selection means for supplying said predetermined logic signal to said selection means to make said selection means switch from said first step size to said second step size.

13. An adaptive filter as claimed in claim 9, said input signal exhibiting an impulse response having a flat delay portion and a dispersive portion having an amplitude greater than said flat delay portion, wherein said control means further comprises:

additional detecting means coupled to said maximum detecting means for detecting whether or not the provisional maximum absolute value signal of each set specifies said dispersive portion to produce an absence signal representative of undetection of said dispersive portion when the provisional maximum absolute signal does not specify said dispersive portion; and logical circuit means coupled to said additional detecting means and said measuring means for supplying a reset signal to said memory means when either one of said undetection signal or said absence signal is produced from said measuring means or said additional detecting means.

14. A method of identifying an unknown system by the use of an adaptive filter, said adaptive filter being operable in response to an input signal and an echo signal which results from said input signal and which is sent from said unknown system to produce an error signal appearing as a result of identification of said unknown system, said input signal being given in the form of a sequence of sampled input signals each of which is sampled at every one of sample periods and being specified by an impulse response having a flat delay portion and a dispersive portion having an amplitude greater than said flat delay portion, said adaptive filter comprising first through N-th delay elements connected in series to one another to define first through N-th taps for successively delaying said sampled input signals by every one of said sample periods to produce first through N-th delayed signals through said first through said N-th taps, respectively, where N is a natural number, a controllable matrix switch supplied with said first through said N-th delayed signals and a switch control signal for selectively switching said first through said N-th taps to select first through M-th taps from said first through said N-th taps and to produce said first through said M-th ones of said delayed signals as first through M-th local signals where M is a natural number not greater than N, first through M-th calculation means supplied with said first through said M-th local signals for carrying out calculations between first through M-th coefficient signals representative of first through M-th coefficients and said first through said M-th local signals to produce first through M-th calculated signals which are representative of first through M-th calculated results, respectively, summing means for summing said first through said M-th coefficient signals to produce an echo replica signal representative of a replica of said echo signal, and subtracting means for subtracting said echo replica signal from said echo signal to produce said error signal, said first through said N-th taps being assigned with tap numbers, respectively, and being divisible into active taps specified by said first through said M-th taps and the remaining inactive taps, said method comprising the steps of:

adaptively selecting renewed active taps on the basis of said first through said M-th coefficient signals and the corresponding tap numbers; and delivering selected tap numbers assigned to selected ones of said renewed active taps as said matrix control signal to said controllable matrix switch.

15. A method as claimed in claim 14, wherein said adaptively selecting step comprises:

monitoring a selected one of said error signal and said first through said M-th coefficient signals to define an interval of time for producing said selected tap numbers;

producing said selected tap numbers within said interval of time as said matrix control signal.

16. A method as claimed in claim 14, wherein said adaptively selecting step comprises the steps of:

calculating absolute values from each set of the first through the M-th coefficient signals;

calculating a maximum one of the absolute values and the corresponding maximum tap number from each set of said first through said M-th coefficient signals;

detecting a minimum one of the absolute values for each set together with the corresponding tap numbers to arrange said absolute values from the minimum absolute value to a larger one in order together with the corresponding tap numbers;

successively memorizing the absolute values and the corresponding tap numbers from the minimum absolute value to the larger one along with the corresponding tap numbers to successively select a new absolute value and the corresponding new tap number from the minimum absolute value and the corresponding minimum tap number to the larger absolute value and its tap number;

calculating a difference between said maximum tap number and said new tap number to produce said new tap number when said difference is smaller than a predetermined threshold value and to send said new tap number as a renewed tap number to a memory having a plurality of addresses assigned to said first through said N-th taps;

rewriting a content of the address corresponding to said renewed tap number; and supplying the contents of the memory to said controllable matrix switch as said matrix control signal.

17. A method as claimed in claim 16, further comprising the steps of:

delaying each maximum tap number for each set to produce a delayed tap number;

detecting coincidence between the delayed tap number and the following maximum tap number to consecutively count the coincidence to a prescribed value; and memorizing a predetermined pattern to said memory when said coincidence is counted to said prescribed value.

* * * * *

UNITED STATES PATENT AND TRADEMARK OFFICE
CERTIFICATE OF CORRECTION

PATENT NO. : 5,245,561
DATED : September 14, 1993
INVENTOR(S) : Akihiko SUGIYAMA It is certified that error appears in the above-identified patent and that said Letters Patent is hereby corrected as shown below:

Col. 4, line 12, delete "$e_k$", and insert --$\underline{e}_k$--;
Col. 4, line 14, delete "$e_k$", and insert --$\underline{e}_k$--;
Col. 4, line 60, delete "$e_k$", and insert --$\underline{e}_k$--.
Col. 13, line 63, delete "valves", and insert --values--.

Signed and Sealed this

Thirtieth Day of August, 1994

Attest:

BRUCE LEHMAN

Attesting Officer    Commissioner of Patents and Trademarks